United States Patent
Motozuka

(10) Patent No.: US 8,261,163 B2
(45) Date of Patent: Sep. 4, 2012

(54) SOFT OUTPUT DECODER, ITERATIVE DECODER, AND SOFT DECISION VALUE CALCULATING METHOD

(75) Inventor: Hiroyuki Motozuka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 830 days.

(21) Appl. No.: 12/377,139

(22) PCT Filed: Aug. 21, 2007

(86) PCT No.: PCT/JP2007/066154
§ 371 (c)(1),
(2), (4) Date: Feb. 11, 2009

(87) PCT Pub. No.: WO2008/023682
PCT Pub. Date: Feb. 28, 2008

(65) Prior Publication Data
US 2010/0169745 A1 Jul. 1, 2010

(30) Foreign Application Priority Data

Aug. 22, 2006 (JP) .................... 2006-225938
Sep. 15, 2006 (JP) .................... 2006-251873

(51) Int. Cl.
*H03M 13/00* (2006.01)
(52) U.S. Cl. .................................. 714/780
(58) Field of Classification Search .......... 714/786, 714/794–795, 800–801; 375/262, 341
See application file for complete search history.

(56) References Cited

U.S. PATENT DOCUMENTS

| | | | |
|---|---|---|---|
| 6,915,474 B2 * | 7/2005 | Taguchi | 714/755 |
| 6,931,583 B2 * | 8/2005 | Trott et al. | 714/780 |
| 7,032,163 B2 | 4/2006 | Yano et al. | |
| 7,096,410 B2 * | 8/2006 | Nagase et al. | 714/790 |
| 7,818,653 B2 * | 10/2010 | Brandman et al. | 714/794 |
| 2007/0033019 A1 | 2/2007 | Yasunaga et al. | |
| 2007/0255558 A1 | 11/2007 | Yasunaga et al. | |
| 2008/0052066 A1 | 2/2008 | Oshikiri et al. | |
| 2009/0016426 A1 | 1/2009 | Sato et al. | |
| 2009/0061785 A1 | 3/2009 | Kawashima et al. | |

FOREIGN PATENT DOCUMENTS

| | | |
|---|---|---|
| JP | 2000-278144 | 10/2000 |
| JP | 2003-23359 | 1/2003 |
| JP | 2003-204272 | 7/2003 |
| JP | 2005-102274 | 4/2005 |

OTHER PUBLICATIONS

English language Abstract of 2000-278144, Oct. 6, 2000.

(Continued)

*Primary Examiner* — Shelly A Chase
(74) *Attorney, Agent, or Firm* — Greenblum & Bernstein, P.L.C.

(57) ABSTRACT

A soft output decoder that receives code words corresponding to information words is provided. The soft output decoder calculates soft decision decoding results of the information words from likelihood values corresponding to candidate values adopted by the information words. The soft output decoder includes a hard decision decoder that decides one of the candidate values as an estimated value. The soft output decoder further includes a likelihood calculator that bans calculation of a likelihood value corresponding to the estimated value and that calculates other likelihood values corresponding to other candidate values in the likelihood values.

17 Claims, 30 Drawing Sheets

OTHER PUBLICATIONS

Robertson et al., "A comparison of optical and sub-optimal MAP decoding algorithms operating in the log domain", IEEE International Conference on Communications, 1955, pp. 1009-1013, vol. 2.

3GPP TS 25.212 v6.3.0 (Dec. 2004), 3rd Generation Partnership Project; Technical Specification Group Radio Access Network; Multiplexing and charmed coding (FDD) (Release 6).

* cited by examiner

|  | ADDITION COUNT | COMPARISON COUNT |
| --- | --- | --- |
| $\gamma$ CALCULATION | 9 | 0 |
| $\alpha$ CALCULATION | 16 | 8 |
| $\beta$ CALCULATION | 16 | 8 |
| $\Lambda$ CALCULATION | 33 | 14 |
| TOTAL | 74 | 30 |

FIG.4

PRIOR ART

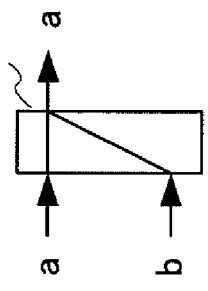
OPERATION OF "SWITCH"
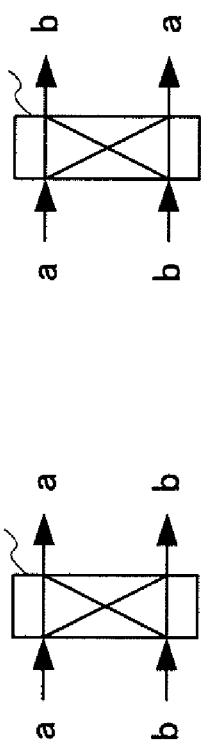
FIG.15A WHEN d(n)=1
FIG.15B WHEN d(n)=0 → TWO DATA POSITIONS ARE SWITCHED
OPERATION OF "SELECTOR"
FIG.15C WHEN d(n)=1, UPPER PART IS OUTPUTTED
FIG.15D WHEN d(n)=0, LOWER PART IS OUTPUTTED

SOFT OUTPUT DECODER, ITERATIVE DECODER, AND SOFT DECISION VALUE CALCULATING METHOD

TECHNICAL FIELD

The present invention relates to a soft output decoder, iterative decoding apparatus and soft decision value calculating method for decoding a digital signal encoded using a convolution code. More particularly, the present invention relates to a soft output decoder and soft decision value calculating method that are preferable for application to an iterative decoding apparatus that carries out decoding using a soft decision decoding result repeatedly.

BACKGROUND ART

It is well settled that the MAP (Maximum A posterior Probability) decoding scheme, which is the maximum a posterior probability decoding method, is presently the best soft output decoding algorithm used in decoding of turbo code. Further, there is a case where, for implementation of the circuit, the Max-log-MAP scheme is used. The Max-log-MAP scheme is similar to the MAP scheme to which log calculation is applied. As a soft decision decoding method for convolution code used inside a turbo decoder, Max-log-MAP and SOYA (Soft Output Viterbi Algorithm) are known to require a comparatively small amount of operation.

However, turbo decoding still requires a large amount of operation compared to other codes, and further reduction in the amount of operation is demanded.

FIG. 1 is a block diagram showing a decoder for describing a conventional Max-log-MAP decoding method.

In FIG. 1, decoder 1 is configured with $\gamma\alpha$ calculating section 11, timing adjusters 12 and 13, $\gamma\beta$ calculating section 14 and $\Lambda$ calculating section 15. $\Lambda$ calculating section 15 is composed of likelihood calculating sections 16 and 17 and subtractor 18.

There are three types of data sequences, systematic s(n), parity p(n) and a priori value e(n), inputted to Max-log-MAP decoder 1. Here, n=0 to K−1 hold, and K is a "block size (i.e. the number of transmission information bits)."

Max-log-MAP decoder 1 finds a soft output value $\Lambda(n)$ from a received sequence y (including vectors s and p) and vector e of an extrinsic value. $\Lambda(n)$ is also referred to as a "posteriori value" and is a log likelihood ratio (LLR) of transmission bits estimated by decoder 1. That is, $\Lambda(n)$ is defined as in following equation 1, and, if $\Lambda(n)>0$, transmission data d(n) of the n-th bit is estimated "0" and, if $\Lambda(n)<0$, d(n) is estimated "1." Further, the operation of acquiring the estimated value d by deciding the sign of LLR is referred to as "hard decision processing."

(Equation 1)

$$\Lambda(n) = \log \frac{p(d(n)=0 \mid y)}{p(d(n)=1 \mid y)} \quad [1]$$

FIG. 2 is a block diagram of turbo decoder 20 using Max-log-MAP decoder 1 as a constituent decoder.

With this example, two Max-log-MAP decoders 1 (hereinafter, "constituent decoders") of FIG. 1 are used. Turbo decoder 20 is composed of two constituent decoders 21 and 22 (Max-log-MAP decoders 1 and 2), adders 23 and 24, interleavers 25 and 26 (interleavers $\pi$), deinterleavers 27 and 28 (deinterleaver $\pi^{-1}$) and sign decider 29 (sign). The interleavers $\pi$ and deinterleavers $\pi^{-1}$ are circuits for rearranging the order of data according to a predetermined method.

Max-log-MAP decoder 21 receives as input systematic s, first parity p1 and the extrinsic value e1 transmitted from Max-log-MAP decoder 22, and outputs $\Lambda1$ which is the first LLR.

As shown in following equation 2, a new extrinsic value e1' is determined by subtracting systematic s and the extrinsic value e1 from $\Lambda1$.

$$e1'(n)=\Lambda1(n)-(s(n)+e1(n)) \quad \text{(Equation 2)}$$

(e2) obtained by interleaving e1', is used as an extrinsic value to input to Max-log-MAP decoder 22. Further, data obtained by interleaving systematic s and second parity p2 are inputted to Max-log-MAP decoder 22.

Based on these inputs, Max-log-MAP decoder 22 outputs $\Lambda2$ which is a second LLR. Similarly, as shown in following equation 3, a new extrinsic value e2' is calculated by subtracting inputted systematic s($\pi$(n)) interleaved and the extrinsic value e2 from $\Lambda2$.

$$e2'(n)=\Lambda2(n)-(s(\pi(n))+e2(n)) \quad \text{(Equation 3)}$$

An input obtained by deinterleaving this new extrinsic value e2' is used as a new input to Max-log-MAP decoder 21. Deinterleaving refers to "reverse rearrangement processing" corresponding to the above interleaving.

Accuracies of $\Lambda1$ and $\Lambda2$ are improved by repeating the above processings. The estimated value d^ of the transmission bits can be acquired by carrying out a sufficient number of times of repetitions, then deciding the sign of $\Lambda2$ and carrying out deinterleaving.

Next, the detailed functions of Max-log-MAP decoding will be described. Here, all the following equations are used to decode turbo code disclosed in Non-Patent Document 1 and are only shown as examples. Generally, the following equations may be different respectively.

The $\alpha$, $\beta$ and $\gamma$ in Max-log-MAP decoding include the following meanings. That is, $\alpha$: a total of likelihoods of a path reaching a certain state
$\beta$: a total of likelihoods of a path beyond a certain state
$\gamma$: likelihoods of branches.

(1) $\gamma$ Calculation $\gamma$ calculation is carried out prior to $\alpha$ calculation and $\beta$ calculation.

The following four $\gamma$'s shown in following equation 4 are calculated from the n-th bit input values s (n), p (n), and e (n).

$$\gamma_{00}(n)=(s(n)+e(n)+p(n))/2$$

$$\gamma_{01}(n)=(s(n)+e(n)-p(n))/2$$

$$\gamma_{10}(n)=(-s(n)-e(n)+p(n))/2$$

$$\gamma_{11}(n)=(-s(n)-e(n)-p(n))/2 \quad \text{(Equation 4)}$$

(2) $\alpha$ Calculation $\alpha$ is calculated according to the recurrence equation shown in following equation 5 using $\gamma$'s determined as described above.

$$\alpha_0(n+1)=\min\{\alpha_0(n)+\gamma_{00}(n),\alpha_4(n)+\gamma_{11}(n)\}$$

$$\alpha_1(n+1)=\min\{\alpha_4(n)+\gamma_{00}(n),\alpha_0(n)+\gamma_{11}(n)\}$$

$$\alpha_2(n+1)=\min\{\alpha_1(n)+\gamma_5(n),\alpha_5(n)+\gamma_{10}(n)\}$$

$$\alpha_3(n+1)=\min\{\alpha_5(n)+\gamma_{01}(n),\alpha_1(n)+\gamma_{10}(n)\}$$

$$\alpha_4(n+1)=\min\{\alpha_2(n)+\gamma_{01}(n),\alpha_6(n)+\gamma_{10}(n)\}$$

$$\alpha_5(n+1)=\min\{\alpha_6(n)+\gamma_{01}(n),\alpha_2(n)+\gamma_{10}(n)\}\alpha_6(n+1)=\min\{\alpha_3(n)+\gamma_{00}(n),\alpha_7(n)+\gamma_{11}(n)\}$$

$$\alpha_7(n+1)=\min\{\alpha_7(n)+\gamma_{00}(n),\alpha_3(n)+\gamma_{11}(n)\} \quad \text{(Equation 5)}$$

In above equation 5, min{a, b} represents an operation of selecting a smaller candidate from two candidates a and b. The initial value of the α is $\alpha_0=0$ and $\alpha_i(0)=+\infty (i>0)$. Further, the α is calculated from the smallest value of n to the largest value of n (i.e. in ascending order), and is referred to as a "forward probability."

(3) β Calculation

Similarly, the β is calculated according to the recurrence equation of following equation 6 using the γ.

$\beta_0(n)=\min\{\beta_0(n+1)+\gamma_{00}(n),\beta_1(n+1)+\gamma_{11}(n)\}$ $\beta_1(n)=\min\{\beta_2(n+1)+\gamma_{01}(n),\beta_3(n+1)+\gamma_{10}(n)\}$ $\beta_2(n)=\min\{\beta_5(n+1)+\gamma_{01}(n),\beta_4(n+1)+\gamma_{10}(n)\}$ $\beta_3(n)=\min\{\beta_7(n+1)+\gamma_{00}(n),\beta_6(n+1)+\gamma_{11}(n)\}$ $\beta_4(n)=\min\{\beta_1(n+1)+\gamma_{00}(n),\beta_0(n+1)+\gamma_{11}(n)\}$ $\beta_1(n)=\min\{\beta_2(n+1)+\gamma_{01}(n),\beta_3(n+1)+\gamma_{10}(n)\}$ $\beta_5(n)=\min\{\beta_3(n+1)+\gamma_{01}(n),\beta_2(n+1)+\gamma_{10}(n)\}$ $\beta_6(n)=\min\{\beta_4(n+1)+\gamma_{01}(n),\beta_5(n+1)+\gamma_{10}(n)\}$ $\beta_7(n)=\min\{\beta_6(n+1)+\gamma_{00}(n),\beta_7(n+1)+\gamma_{11}(n)\}$  (Equation 6)

Further, the β is calculated from the largest value of n to the smallest value of n (i.e. in descending order). γ calculation carried out prior to β calculation is carried out according to the flow of β calculation. Then, s, p and e are rearranged by a FILO (First-In Last-Out) buffer and inputted to γ calculating section 14a. Further, the β is referred to as the "backward probability."

(4) Λ calculation

In Λ calculation, log likelihoods $\lambda_0(n)$ and $\lambda_1(n)$ are determined per bit using following equations 7 and 8. The difference between these is the log likelihood ratio (LLR) Λ(n) shown in following equation 9.

(Equation 7)

$$\lambda(n) = \min\begin{Bmatrix} \alpha_0(n) + \beta_0(n) + \gamma_{00}(n), \\ \alpha_1(n) + \beta_2(n) + \gamma_{01}(n), \\ \alpha_2(n) + \beta_5(n) + \gamma_{01}(n), \\ \alpha_3(n) + \beta_7(n) + \gamma_{00}(n), \\ \alpha_4(n) + \beta_1(n) + \gamma_{00}(n), \\ \alpha_5(n) + \beta_3(n) + \gamma_{01}(n), \\ \alpha_6(n) + \beta_4(n) + \gamma_{01}(n), \\ \alpha_7(n) + \beta_6(n) + \gamma_{00}(n) \end{Bmatrix}$$ [2]

(Equation 8)

$$\lambda_1(n) = \min\begin{Bmatrix} \alpha_0(n) + \beta_1(n) + \gamma_{11}(n), \\ \alpha_1(n) + \beta_3(n) + \gamma_{10}(n), \\ \alpha_2(n) + \beta_4(n) + \gamma_{10}(n), \\ \alpha_3(n) + \beta_6(n) + \gamma_{11}(n), \\ \alpha_4(n) + \beta_0(n) + \gamma_{11}(n), \\ \alpha_5(n) + \beta_2(n) + \gamma_{10}(n), \\ \alpha_6(n) + \beta_5(n) + \gamma_{10}(n), \\ \alpha_7(n) + \beta_7(n) + \gamma_{11}(n) \end{Bmatrix}$$

(Equation 9)

$\Lambda(n) = \lambda_1(n) - \lambda_0(n)$

In λ calculation, α value is calculated using both α and β. The α is calculated in ascending order of n and the β is calculated in descending order of n, and so the α or β needs to be rearranged and used.

In FIG. 1, the α is rearranged by the FILO buffer and the λ is calculated sequentially from the largest value of n to the smallest value of n.

FIG. 3 is a flowchart of Max-log-MAP decoding and, in this figure, ST refers to each "step" in the flowchart. This flow is executed appropriately when the α and β are calculated. Further, the description of y calculation is omitted.

First, α(n) is calculated for n=0 to K−1 in steps ST1 and ST2. Here, calculation of α(n) means calculating eight values of α0(n) to α7(n). Calculated α(n) is stored in timing adjuster (i.e. FILO memory) 12.

Next, β(n) is calculated for n=K−1 to 0, insteps ST3 and ST4. After β(n) is calculated, $\lambda 0(n)$ and $\lambda 1(n)$ are calculated in step ST5 and Λ(n) is calculated in step ST6. α(n) stored in timing adjuster 12 is used to calculate $\lambda 0(n)$ and $\lambda 1(n)$. While the α is calculated in order from 0 to K−1, the λ is calculated in order from K−1 to 0, and so the timing adjuster is used.

Further, β calculation, λ calculation and Λ calculation are often pipelined. That is, while $\lambda 0(n)$ and $\lambda 1(n)$ are calculated, β(n−1) is calculated. Then, soon after calculation of $\lambda 0(n)$ and $\lambda 1(n)$ is finished, calculation of $\lambda 0(n-1)$ and $\lambda 1(n-1)$ can be started.

Patent Document 1: Japanese Patent Application Laid-Open No. 2000-278144

Non-Patent Document 1: "A comparison of optimal and suboptimal MAP decoding algorithms operating in the log domain," Robertson, P., Villebrun, E., Hoeher, P., IEEE International Conference on Communications, 1995. Page(s): 1009-1013 vol. 2

Non-Patent Document 2: 3GPP TS 25.212 v6.3.0

DISCLOSURE OF INVENTION

Problems to be Solved by the Invention

However, such a conventional Max-log-MAP decoding method requires a plurality of addition processings and comparison and selection processings as described above. FIG. 4 shows the number of operations per Max-log-MAP bit in the table.

As shown in the table of FIG. 4, given that the Max-log-MAP operator using a conventional Max-log-MAP decoding method requires a large amount of operation required for Λ calculation, there is a problem that the operation circuit cannot be made smaller and the processing delay time cannot be reduced.

Further, though a Max-log-MAP decoding method needs to acquire only an estimated value of hard decision in the final stage of iterative decoding, the turbo decoder using a conventional Max-log-MAP decoding method needs to carry out hard decision after a soft decision value is determined once. Therefore, there is a problem that the large amount of operation is required and power consumption of the operation circuit cannot be reduced.

Further, there is a problem that the SOVA scheme is inferior to the Max-log-MAP scheme in error rate characteristics and involves the complex memory operation.

It is therefore an object of the present invention to provide a soft output decoder, iterative decoding apparatus and soft decision value calculating method for decreasing the amount of operation required for likelihood calculation and realizing a smaller operation circuit and reducing the processing delay time.

Means for Solving the Problem

The soft output decoder according to the present invention that receives code words corresponding to a plurality of information words and calculates soft decision decoding results of the information words from a plurality of likelihood values corresponding to a plurality of candidate values adopted by the information words, employs a configuration including: a hard decision decoding section that decides one of the plurality of candidate values as an estimated value; and a likelihood calculating section that bans calculation of a likelihood value corresponding to the estimated value and calculates likelihood values corresponding to other candidate values in the plurality of likelihood values.

The iterative decoding apparatus according to the present invention is an iterative decoding apparatus that repeats soft output decoding and includes the soft output decoder according to the present invention, and this soft output decoder includes: a boundary likelihood calculating section that defines one of the information words as a boundary portion and finds a plurality of boundary likelihood values corresponding to the plurality candidate values adopted by the information words in the boundary portion; and an initial state number specifying section that specifies a state number to which a maximum likelihood branch is connected using the boundary likelihoods and the hard decision decoding section decides an estimated value for information words other than the boundary portion using the state number, and this iterative decoding apparatus further employs a configuration including a commanding section that, when repetition is final, commands the soft output decoder to output the hard decision value and to stop outputting the soft decision value.

The soft decision value calculating method according to the present invention for receiving code words corresponding to a plurality of information words and calculating soft decision decoding results of the information words from a plurality of likelihood values corresponding to a plurality of candidate values adopted by the information words, includes: deciding one of the plurality of candidate values as an estimated value; and banning calculation of a likelihood value corresponding to the estimated value and calculating likelihood values corresponding to other candidate values in the plurality of likelihood values.

Advantageous Effect of the Invention

The present invention is able to decrease the amount of operation required for likelihood calculation and realize a smaller operation circuit, lower power consumption and reduced processing delay time. By applying the present invention to the Max-log-MAP decoding method, the amount of operation in turbo decoding can be decreased significantly.

BRIEF DESCRIPTION OF DRAWINGS

FIG. 4 shows the table listing the number of operations per conventional Max-log-MAP bit;

FIG. 15 illustrates operations of switches and selectors of the losing likelihood calculating section of FIG. 14;

BEST MODE FOR CARRYING OUT THE INVENTION

Figure 1:
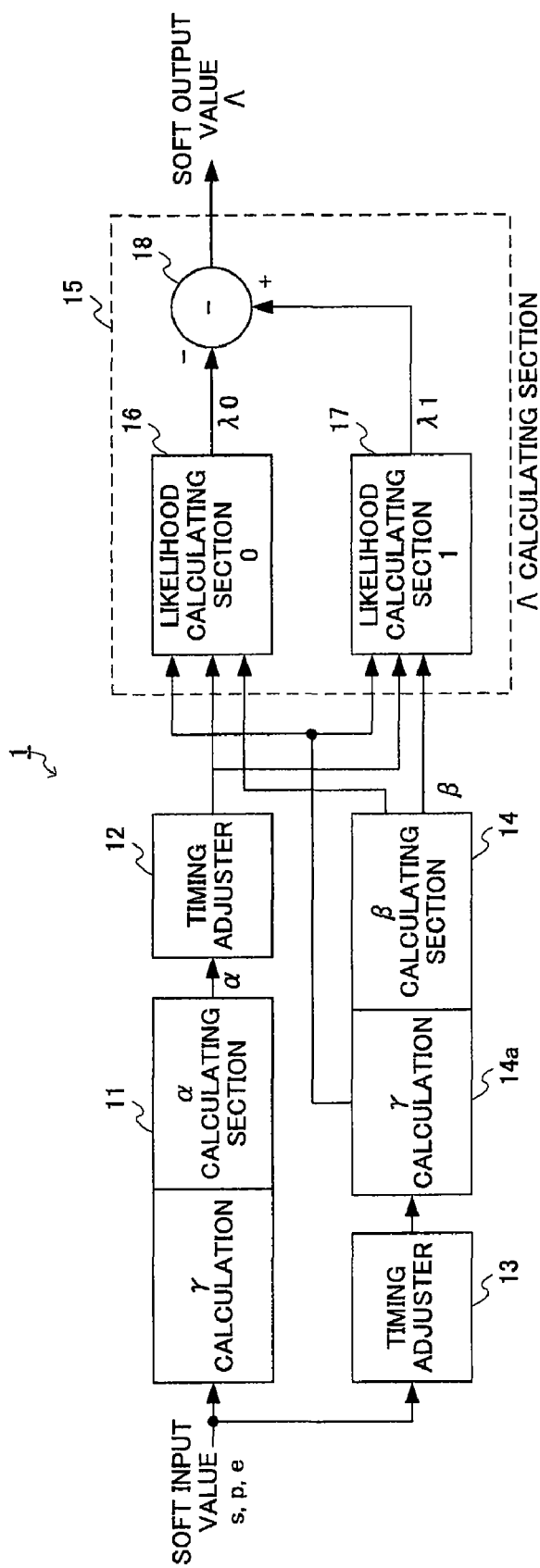
FIG. 1 is a block diagram of a decoder for illustrating a conventional Max-log-MAP decoding method.
Figure 2:
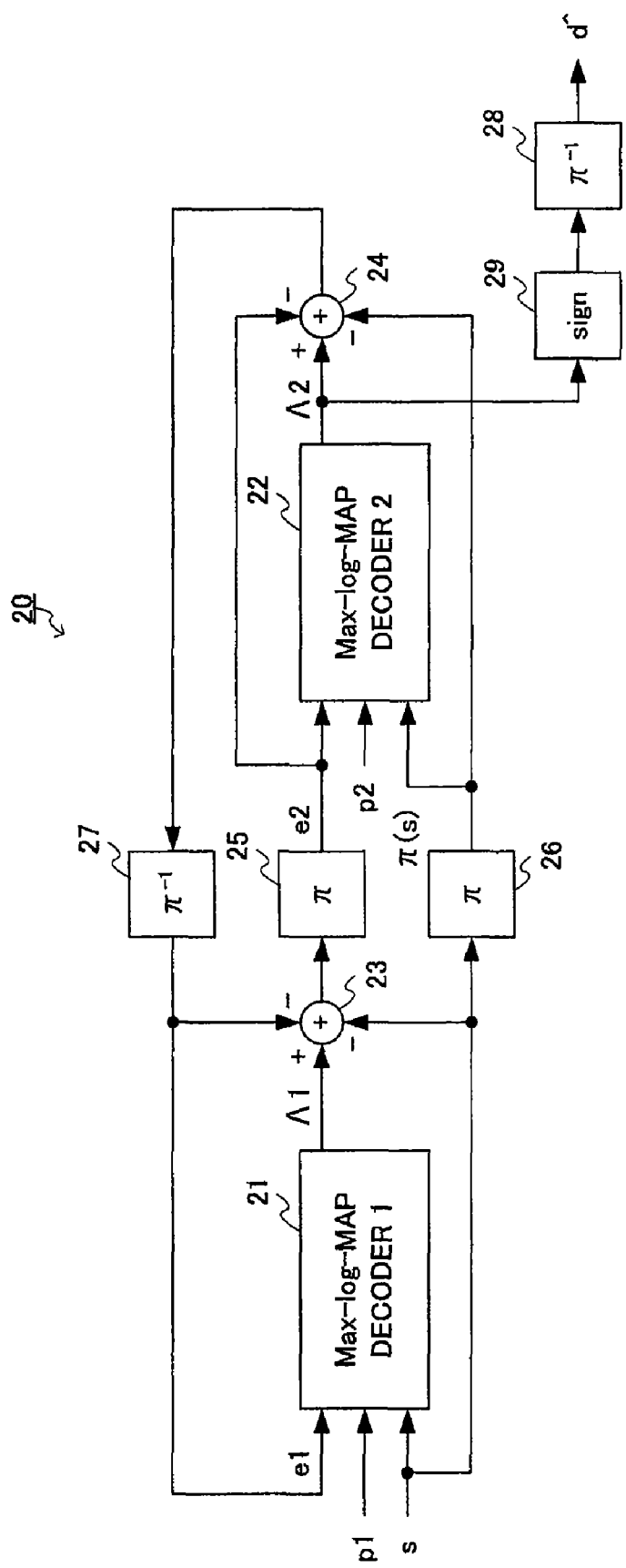
FIG. 2 is a block diagram of a turbo decoder using a conventional Max-log-MAP decoder as a constituent decoder.
Figure 3:
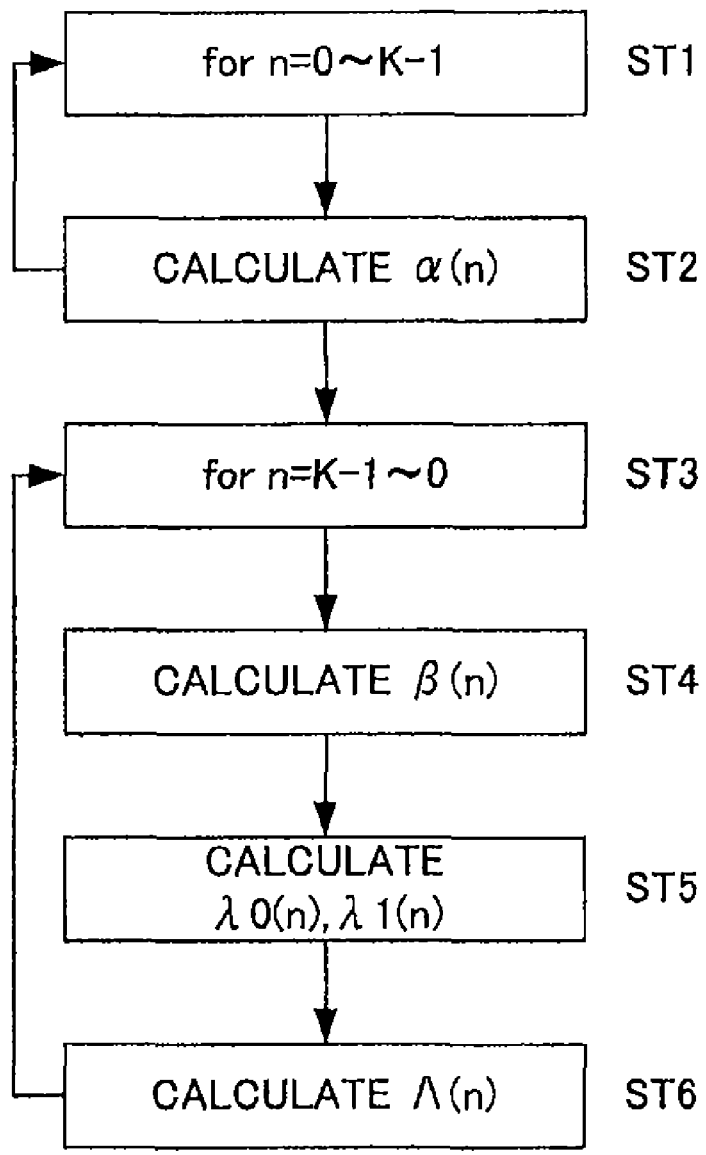
FIG. 3 is a flowchart illustrating processing of a conventional Max-log-MAP decoder.

Embodiments of the present invention will be described below in detail with reference to the accompanying drawings.

(Basic Principle)

First, the basic principle of the present invention will be described.

To describe the principle of the invention, illustration of a Max-log-MAP decoding method by a graph will be introduced. Hereinafter, in the drawings referred to in the embodiments, the solid lines in trellis diagrams are branches corresponding to transmissionbit=0 and the broken lines are branches corresponding to transmission bit=1.

Figure 5:
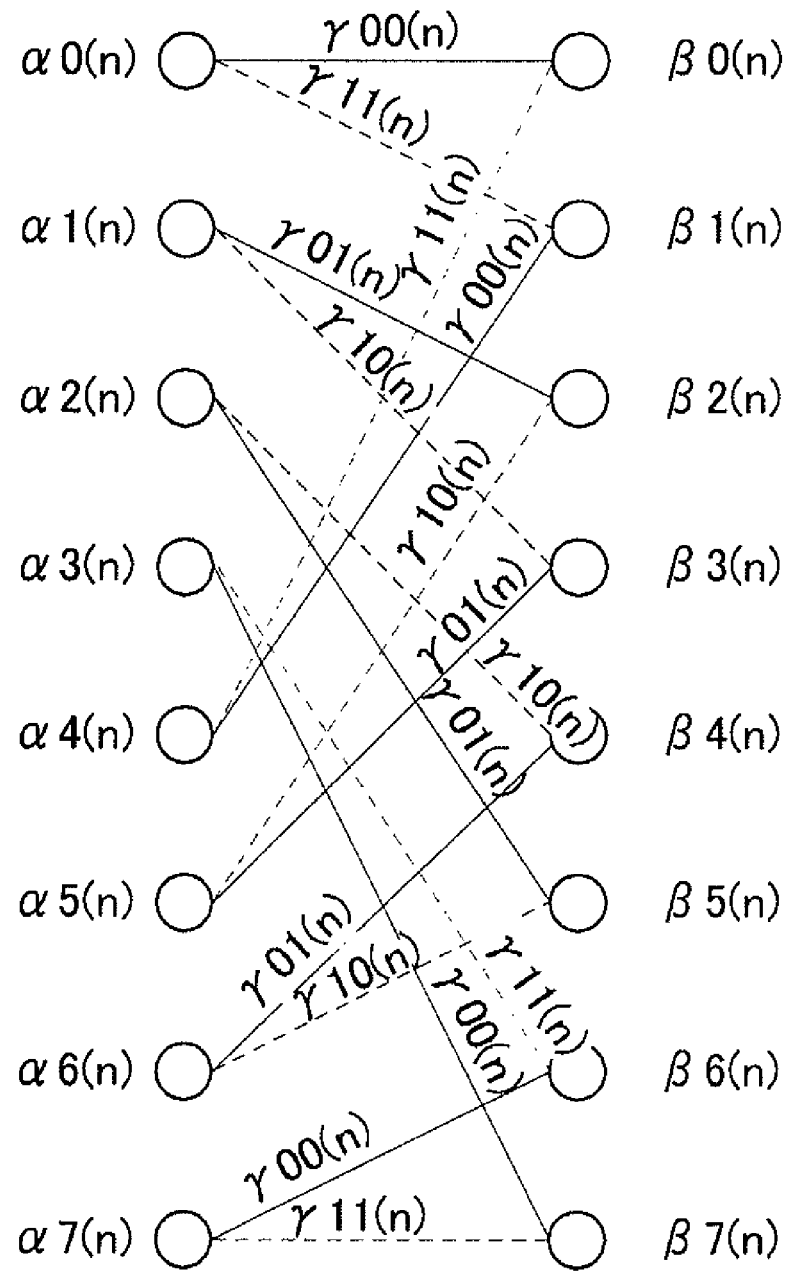
FIG. 5 illustrates equations of log likelihoods $\lambda 0$ and $\lambda 1$ per bit.

FIG. 5 is a graph (i.e. trellis diagram) illustrating equations of λ0 and λ1.

λ0 is calculated by calculating α+β+γ corresponding to the eight solid lines shown in FIG. 5 and finding the minimum value from these, and λ1 is calculated by finding the minimum value of α+β+γ corresponding to the eight broken lines shown in FIG. 5. Further, the number of nodes aligned vertically in the graph is referred to as "the number of states." Here, the turbo coding scheme of Non-Patent Document 1 is used, and so the number of states is eight. Further, connections (branches) between nodes are determined depending on the coding scheme.

Figure 6:
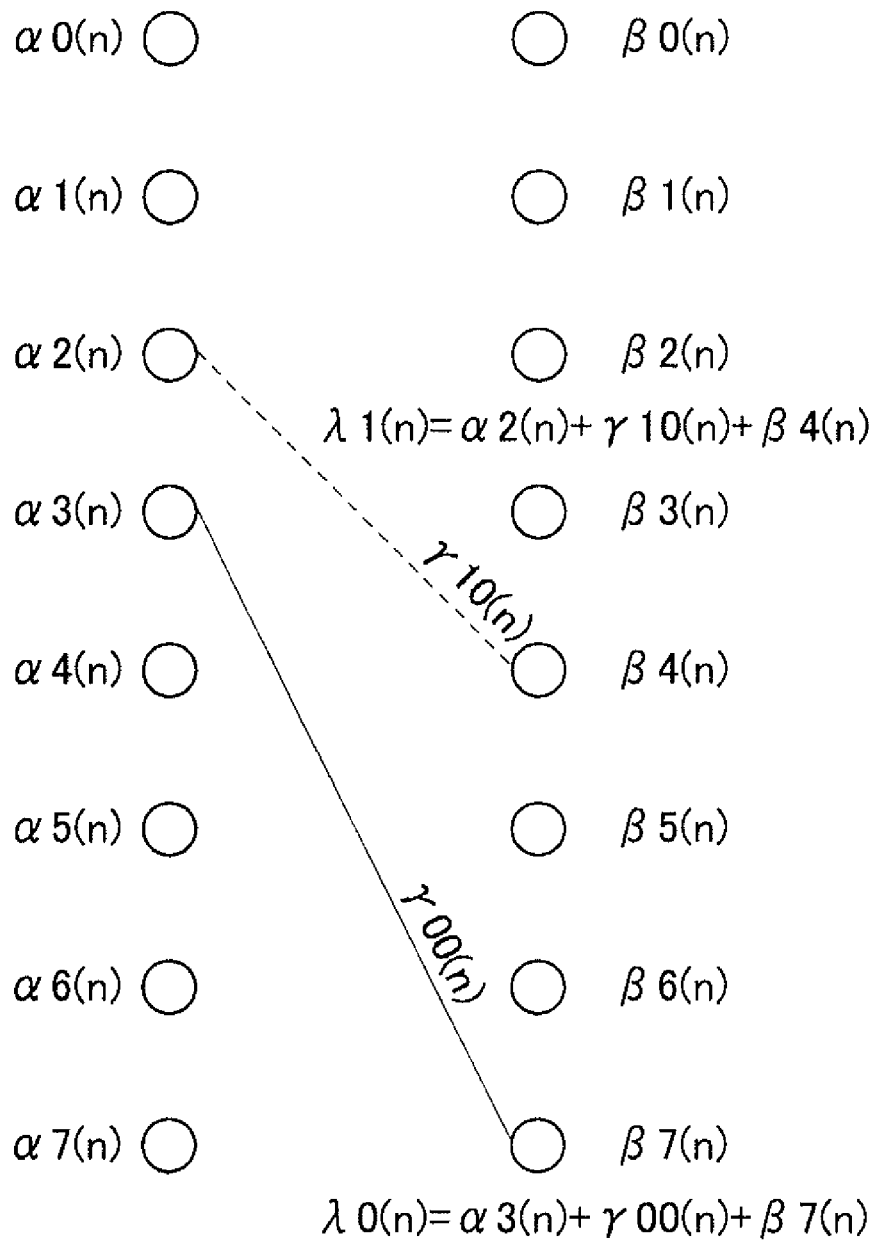
FIG. 6 illustrates a method of calculating the likelihood ($\alpha+\beta+\gamma$) corresponding to the maximum likelihood branch in Max-log-MAP decoding.

FIG. 6 illustrates a method of calculating the likelihood (α+β+γ) corresponding to the maximum likelihood branch in Max-log-MAP decoding.

As shown in FIG. 6, Max-log-MAP decoding is directed to finding the likelihood (α+β+γ) corresponding to two of the maximum likelihood branch in the solid line (i.e. transmission bit: 0) and the maximum likelihood branch in the broken line (i.e. transmission bit: 1). With the example of FIG. 6, the likelihood (α+β+γ) of branches α3(n) to β7(n) of the maximum likelihood branch (i.e. transmission bit: 0) is λ0(n)=α3(n)+γ00(n)+β7(n) and the likelihood (α+β+γ) of branches α2(n) to β4(n) of the maximum likelihood branch (i.e. transmission bit: 1) is λ1(n)=α2(n)+γ10(n)+β4(n).

In this way, according to the LLR calculating method, α+β+γ is calculated for total sixteen branches, the maximum likelihood value is selected from branches (eight branches) corresponding to transmission bit=0 and the maximum likelihood value is selected from branches (eight branches) corresponding to transmission bit=1. The difference between two maximum likelihood values λ0 and λ1 is the soft decision value.

The above is a general concept of Max-log-MAP decoding and the invention based on the inventor's observation and property found by this observation will be described.

Next, two consecutive time points will be discussed. Here, a time point refers to the period it takes to decode one bit, in the graph.

Figure 7:
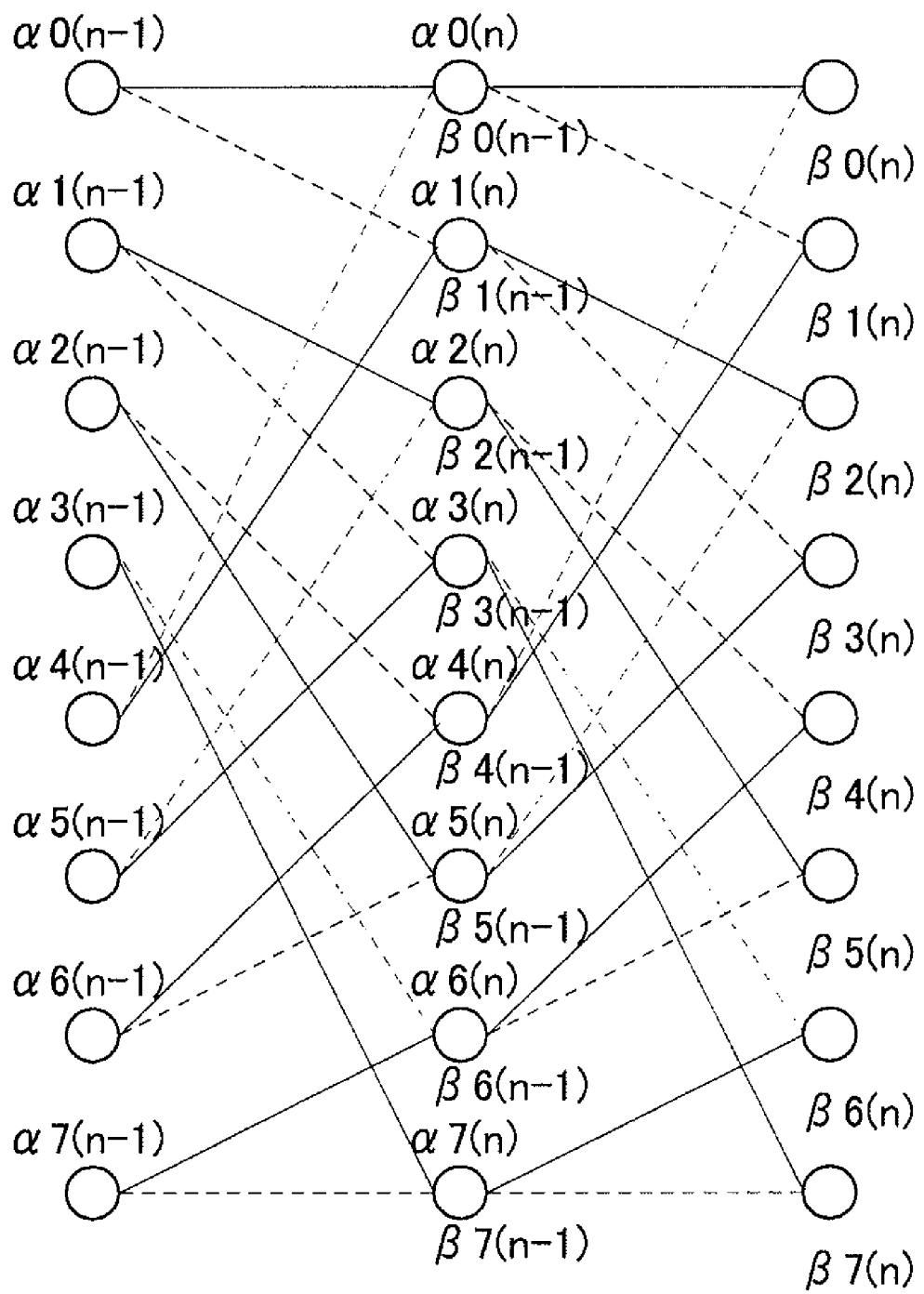
FIG. 7 is a trellis diagram illustrating Max-log-MAP decoding.

FIG. 7 is a trellis diagram illustrating Max-log-MAP decoding.

In FIG. 7, λ is calculated in each time point. That is, λ=α+β+γ corresponding to "the maximum likelihood branch in solid lines" and "the maximum likelihood branch in broken lines" are determined. The result is as shown in, for example, FIG. 8.

Figure 8:
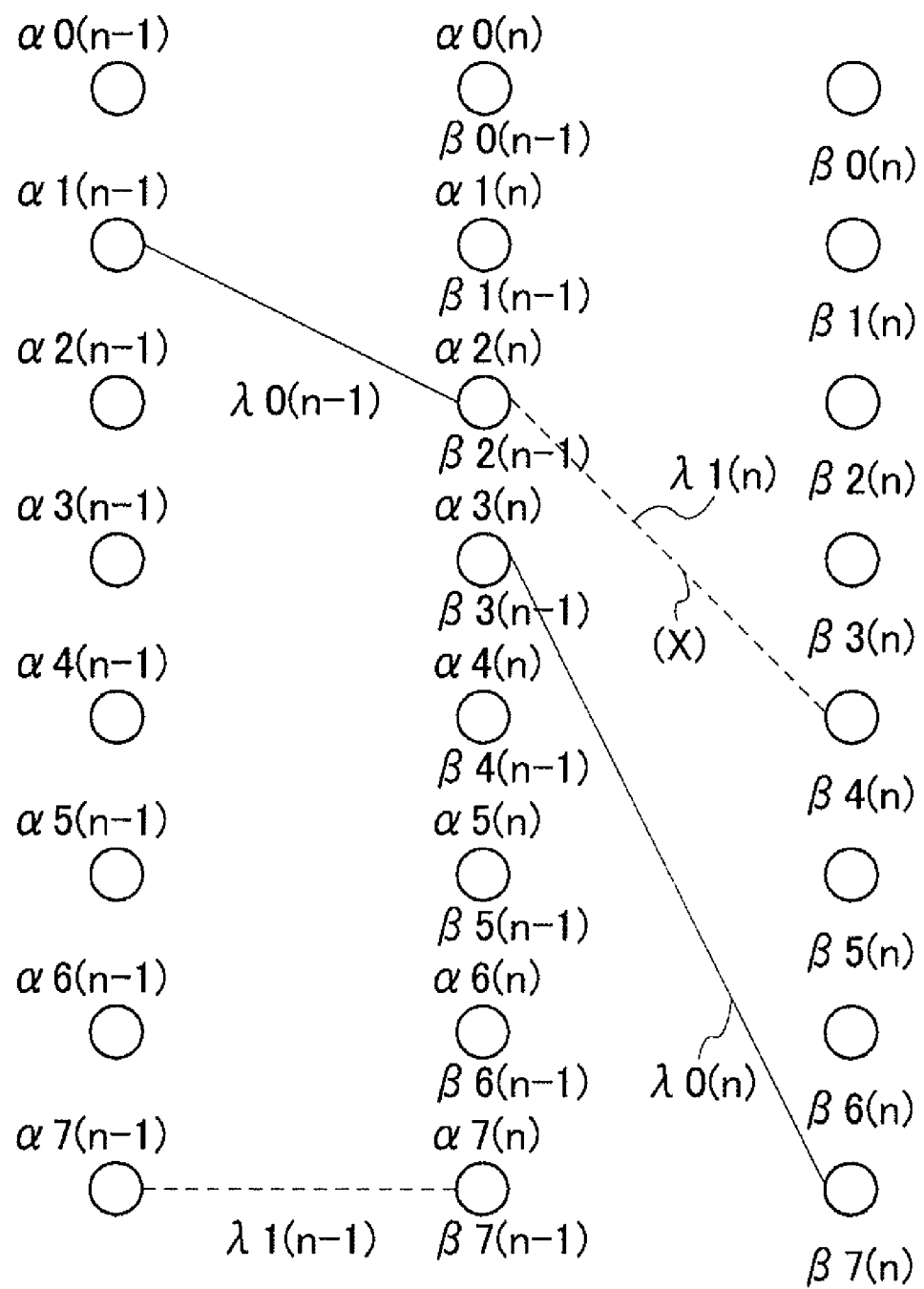
FIG. 8 illustrates a result of $\lambda$ calculation in each time point in FIG. 7.

FIG. 8 illustrates a result of λ calculation in each time point in FIG. 7.

Here, the higher likelihood between "the maximum likelihood branch in solid lines" and "the maximum likelihood branch in broken lines" will be referred to as "the maximum likelihood branch." For example, if λ0(n)>λ1(n) holds in FIG. 7, the broken line (X) in FIG. 8 is the maximum likelihood branch in time point n.

Now, the following assumption is provided.

[Assumption 1] The likelihood values in maximum likelihood branches are fixed values.

Further, although this is an assumption here, no calculation error has occurred when this assumption is actually evaluated based on <algorithm 1> described later. That is, with [assumption 1], practically, there is no problem.

Utilizing these assumptions, with the present invention, Max-log-MAP decoding is carried out as follows.

<Algorithm 1> (1) The type of the maximum likelihood branch (either 0: the solid line or 1: the broken line) is specified. (2) If the bit corresponding to the maximum likelihood branch is 0 (i.e. the solid line) in the time point n, assuming that λ0(n)=λwin, only λ1(n) is calculated using above equation 8. If the bit is 1, assuming that λ1(n)=λwin, only λ0(n) is calculated using above equation 7.

By so doing, the calculation of one of λ0(n) and λ1(n) can be omitted.

Next, the method of specifying the type of the maximum likelihood branch will be described. According to conventional Max-log-MAP decoding, it is not until both λ0(n) and λ1(n) are calculated that the maximum branch can be specified. However, if the maximum likelihood branch cannot be specified without calculating λ0(n) and λ1(n), the effect of reducing the amount of operation according to <algorithm 1> is not possible.

The following assumption is provided to think about the method of specifying the type of the maximum likelihood branch.

[Assumption 2] The maximum likelihood branch is connected continuously on the graph.

Further, although this is an assumption here, no calculation error has occurred when this assumption is actually evaluated based on <algorithm 1-A> described later. That is, with [assumption 2], practically, there is no problem.

Here, the series of the maximum likelihood branches will be referred to as a "maximum likelihood path."

According to [assumption 2], all maximum likelihood branches can be specified by tracing the maximum likelihood path using one maximum likelihood branch as the base point. Further, a node through which the maximum likelihood path pass will be referred to as a "maximum likelihood path state." The maximum likelihood path can be specified by specifying the maximum likelihood path states one after another using one maximum likelihood path state as the base point. This algorithm will be described below.

<Algorithm 1-A> (Method of specifying the type of a maximum likelihood branch) (1-1) The maximum likelihood path state initial value is specified. (1-2) By comparing the likelihoods of branches connected to the maximum likelihood path state, a branch having the highest likelihood is the maximum likelihood branch. Information showing whether the branch is a branch corresponding to 0 (i.e. a solid line) or a branch corresponding to 1 (i.e. a broken line) is outputted. (1-3) The connection destination of the maximum likelihood branch is specified as the next maximum likelihood path state.

Then, above (1-2) and (1-3) are repeated.

<Algorithm 1-A> will be described in detail using FIG. 9.

Figure 9:
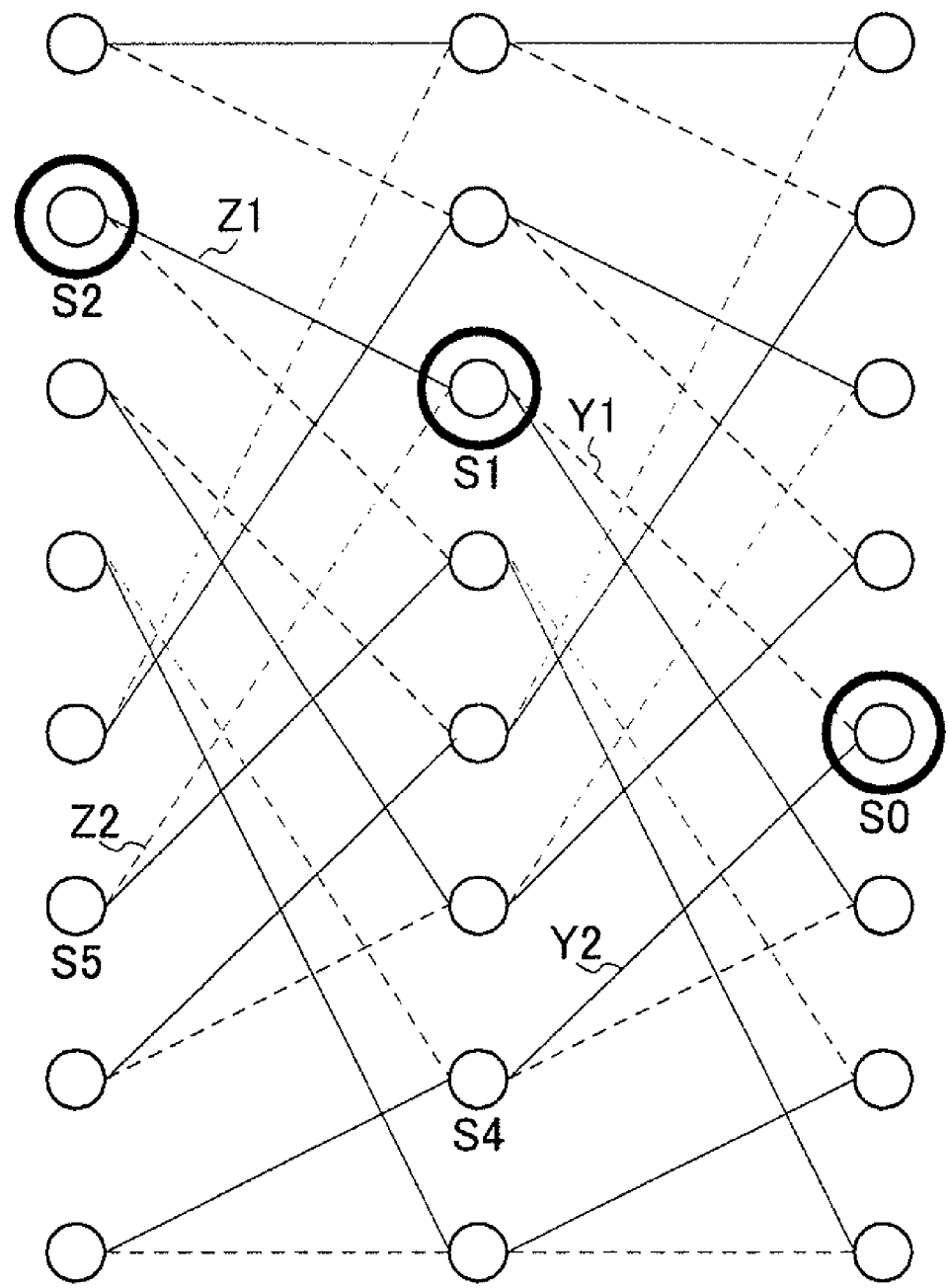
FIG. 9 illustrates an algorithm showing an example of the principle of the present invention.

FIG. 9 illustrates an algorithm showing an example of the principle of the present invention.

In FIG. 9, the maximum likelihood path state, base point, (referred to as "the maximum likelihood path state initial value") is specified in step (1-1). The method will be described later. Here, assume that the node S0 is the maximum likelihood path state initial value.

Branches connected to S0 are only Y1 and Y2 and so the next maximum likelihood path state is one of S1 and S4.

α+β+γ is calculated to specify which one of Y1 and Y2 is the maximum likelihood branch is specified in step (1-2). The likelihood (λ[Y1]) of Y1 is calculated according to λ[Y1]=α2(n)+β4(n)+γ10(n) and the likelihood (λ[Y2]) of Y2 is calculated according to λ[Y2]=α6(n)+β4(n)+γ01(n). Then, λ[Y1] and λ[Y2] are compared, and, if the likelihood of λ[Y1] is greater (if the value is smaller), Y1 is the maximum likelihood branch. Consequently, the value 1 corresponding to the maximum likelihood branch is outputted.

The maximum likelihood branch can be specified in above (1-2), so that, in step (1-3), S1, which is the connection destination, can be specified as the maximum likelihood path state.

In this case, only the relationship between sizes of λ[Y1] and λ[Y2] needs to be determined, and so β4(n), a common term, may be omitted and two of λ'[Y1]=α2(n)+γ10(n) and λ'[Y2]=α6(n)+γ01(n) may be compared.

S1 can be specified as the maximum likelihood path state, and, consequently, the next maximum likelihood path state S2 can be specified in the same steps.

As described above, <algorithm 1-A> makes it possible to acquire the same result as when hard decision is carried out after Max-log-MAP decoding is carried out, without calculating all likelihoods, and, consequently, Max-log-MAP decoding in which the amount of operation for likelihood calculation is reduced can be realized by utilizing the result in the above step (1) of <algorithm 1>.

By this means, Max-log-MAP decoding is different from the step referred to as "Λ operation (i.e. LLR operation)" in the conventional Max-log-MAP decoding method, and processing to calculate all branches (for example, sixteen branches) becomes unnecessary even though only two values are used finally, so that the amount of calculation is decreased.

By the way, <algorithm 1-A> does not aim to completely specify maximum likelihood branches, but requires only types of maximum likelihood branches. Consequently, instead of <algorithm 1-A>, a generally known hard decision decoding method (for example, the Viterbi decoding method) may be employed in the above step (1) of <algorithm 1-A>.

Although it is anticipated that an ideal Viterbi decoding result and an ideal Max-log-MAP decoding hard decision result match, simple implementation methods such as the register exchanging method for Viterbi decoding and the sliding window method for Max-log-MAP are employed in practice, and so the results are not likely to match. In this case, although the effect of reducing the amount of operation can be acquired by applying <algorithm 1>, some calculation errors occur.

Next, how to find the maximum likelihood path state initial value in <algorithm 1-A> will be described. Processing of calculating the maximum likelihood path state initial value in <algorithm 1-A> will be described in <algorithm 1-A-1>.

<Algorithm-A-1> (1-1-1) In the time point K−1 (that is, for the last bit of the decoding target), the likelihoods λ0(K−1) and λ1(K−1) are calculated in the same way as in general Max-log-MAP decoding. At this point, which branch is the maximum likelihood branch is stored. (1-1-2) The node to which the maximum likelihood branch is connected is made the maximum likelihood path state initial value. Using this node as the base point, processing of n=K−2 to 0 is carried out according to <algorithm 1-A>. (1-1-3) Further, in the likelihoods λ0(K−1) and λ1(K−1) determined in (1-1-1), the higher likelihood (i.e. the smaller value) is made λwin in algorithm 1.

Figure 10:
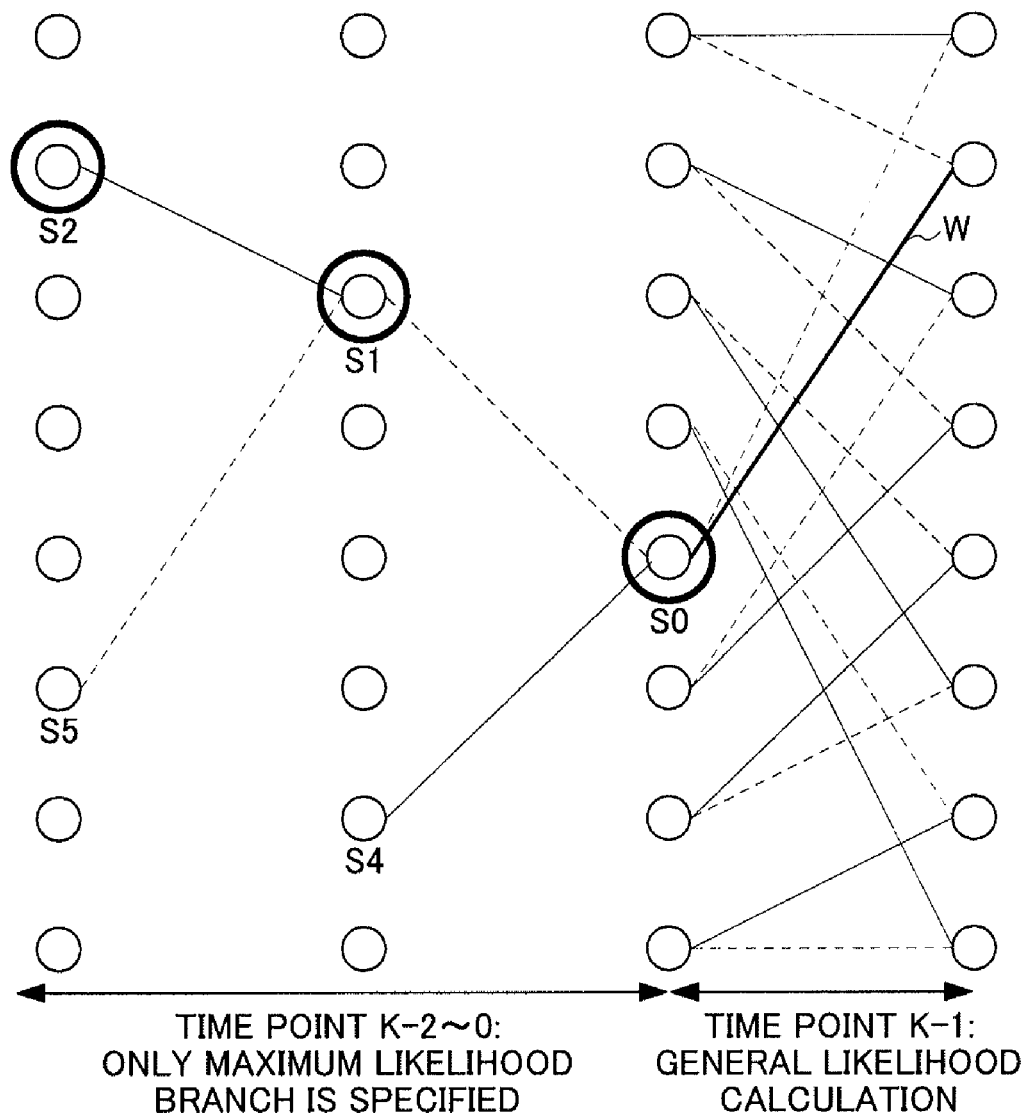
FIG. 10 illustrates how to find the maximum likelihood path state initial value according to <algorithm 1-A>.

FIG. 10 illustrates how to find the maximum likelihood path state initial value in <algorithm 1-A-1>.

As shown in FIG. 10, only in the time point K−1 of the rightmost end on the graph, the same likelihood calculation as general Max-log-MAP decoding is carried out and the maximum likelihood branch is further specified. For example, assume that the branch W is the maximum likelihood (1-1-1).

Then, the node S0 is decided as the maximum likelihood path state, and so <algorithm 1-A> is applied to n=K−2 to 0 using the node S0 as the base point.

By so doing, completely the same result as when hard decision is carried out after general Max-log-MAP decoding is carried out can be acquired, and, as a result, the amount of operation for likelihood calculation with respect to n=K−2 to 0 can be reduced according to algorithm 1.

Further, a method different from <algorithm 1-A> also makes it possible to acquire types of maximum likelihood branches (acquire the hard decision value). This method will be described.

Method in Place of <Algorithm 1-A>

To prepare description, α calculation is shown by the graph.

Figure 11:
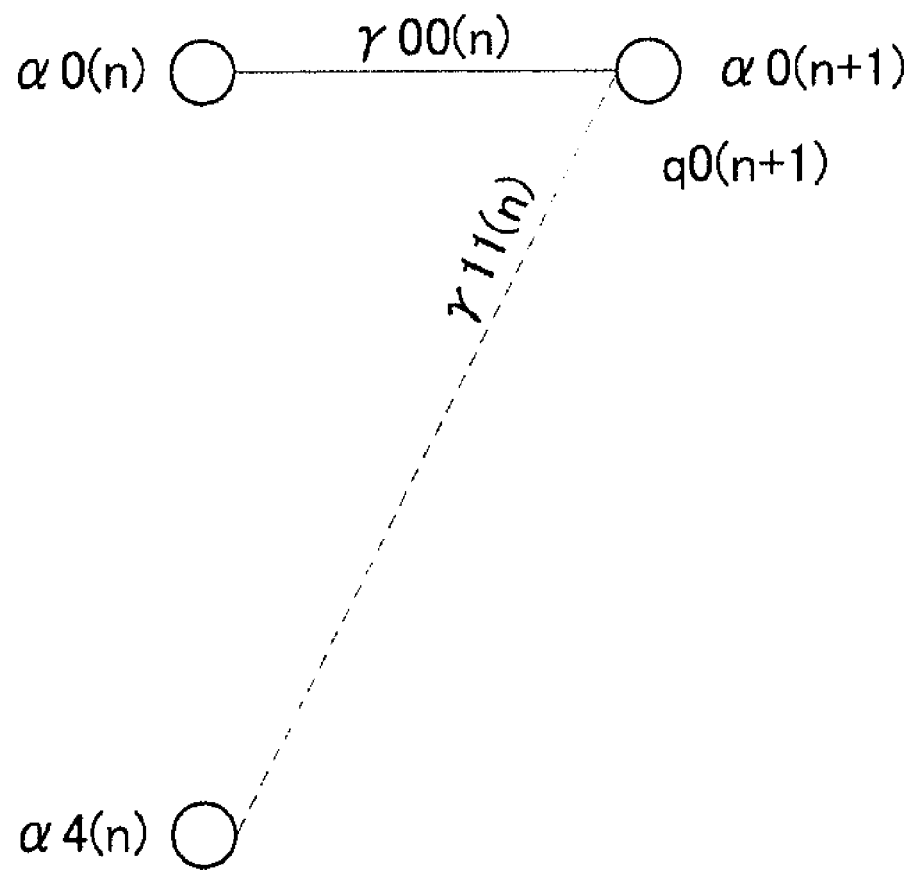
FIG. 11 shows an example of a graph representing a calculation.

FIG. 11 shows an example of a graph showing a calculation. The graph of FIG. 11 shows $\alpha_0(n+1)=\min\{\alpha_0(n)+\gamma_{00}(n), \alpha_4(n)+\gamma_{11}(n)\}$, which is the first equation in above equation 5.

As shown in FIG. 11, in α calculation, focusing on a given node, α+γ is calculated for each branch connected to the left side of the node and the highest likelihood value is selected.

By the way, according to (1-2) of <algorithm 1-A>, by selecting α+γ of the larger from branches connected to the left side of the maximum likelihood path state, the maximum likelihood branch is specified and the hard decision value is acquired.

Then, in α calculation, when the values of α+γ are compared, and information q showing which one of likelihoods is higher is stored, and, when the maximum likelihood branch is specified according to algorithm 1-A upon Λ calculation, by referring to information q, α+γ needs not to be calculated and compared again.

For example, in FIG. 11, when α0(n)+γ00(n)<α4(n)+γ11(n) (that is, the likelihood of the former is higher), q0(n+1) is set to become equal to 0. α0(n+1) to α7(n+1) are calculated and stored for all states 0 to 7, and q0(n) to q7(n) are also stored. The following <algorithm 1-B> can be acquired from the above observation.

<Algorithm 1-B> (1-0B) In α calculation, path selection information q is stored. (1-1) The maximum likelihood path state initial value is specified. (1-2B) Referring to path selection information q corresponding to the maximum likelihood path state, the maximum likelihood branch is specified from the branches to connect with. Information showing whether the branch is a branch corresponding to 0 (i.e. a solid line) or a branch corresponding to 1 (i.e. a broken line) is outputted. (1-3) The connection destination of the maximum likelihood branch is specified as the next maximum likelihood path state.

After (1-3), the processings of above (1-2B) and (1-3) are repeated.

As described above, compared to <algorithm 1-A>, according to <algorithm 1-B>, while the memory storing path selection information increases, the processing of the step (1-2) is simplified.

The same method as <algorithm 1-A> can be applied to specify the maximum likelihood path state initial value in the above step (1-1). That is, <algorithm 1-A-1 and <algorithm 1-B> can be used in combination. Details of this combination will be described in Embodiment 2.

In this way, the present invention is directed to reducing the amount of calculation by deciding branches of higher likelihoods in advance and by omitting calculation of branches of the same type as the branches of higher likelihoods.

Embodiment 1

The present embodiment shows examples of implementation of above <algorithm 1>, <algorithm 1-A> and <algorithm 1-A-1>.

Figure 12:
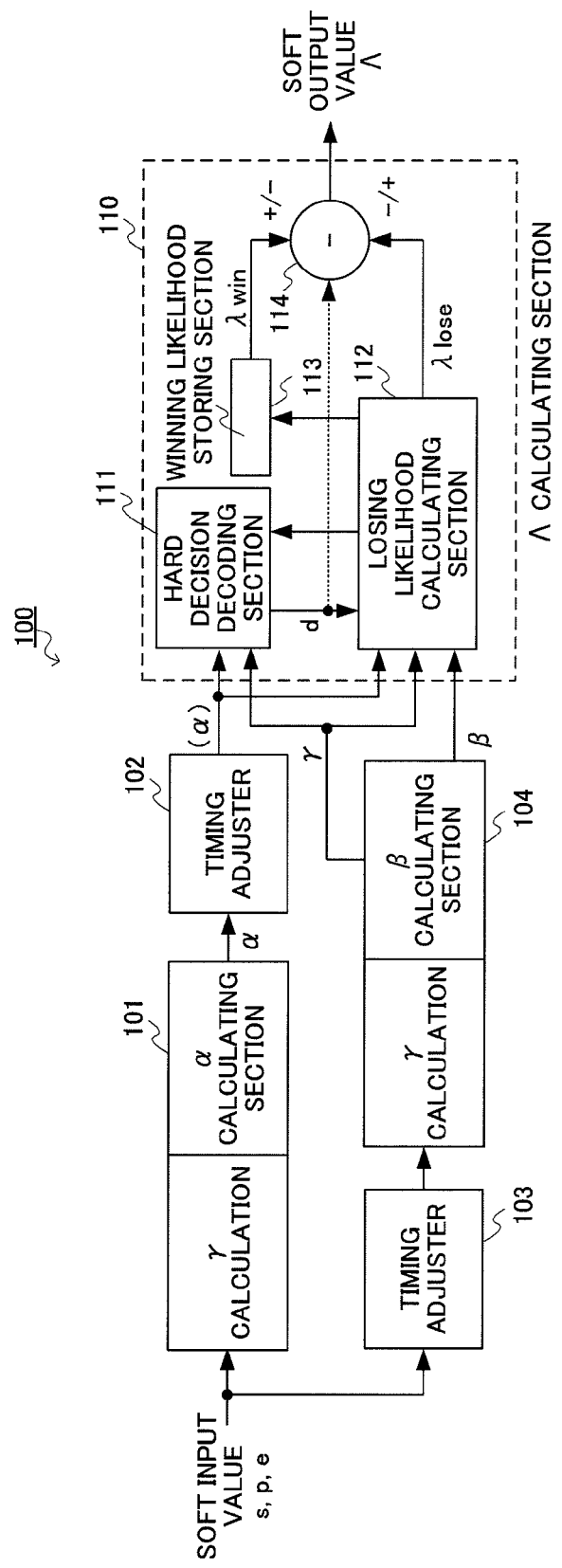
FIG. 12 is a block diagram showing a schematic configuration of a soft output decoder according to Embodiment 1 of the present invention.

FIG. 12 is a block diagram showing a schematic configuration of the soft output decoder according to Embodiment 1 of the present invention. The present embodiment is an example where the present invention is applied to Max-log-MAP decoding used in a constituent decoder for a turbo decoder.

In FIG. 12, soft output decoder 100 is configured with γα calculating section 101, timing adjusters 102 and 103 composed of FILO memories, γβ calculating section 104 and Λ calculating section 110. Λ calculating section 110 is composed of hard decision decoding section 111, losing likelihood calculating section 112, winning likelihood storing section 113 and subtractor 114.

The operation of soft output decoder 100 configured as described above will be described below.

Figure 13:
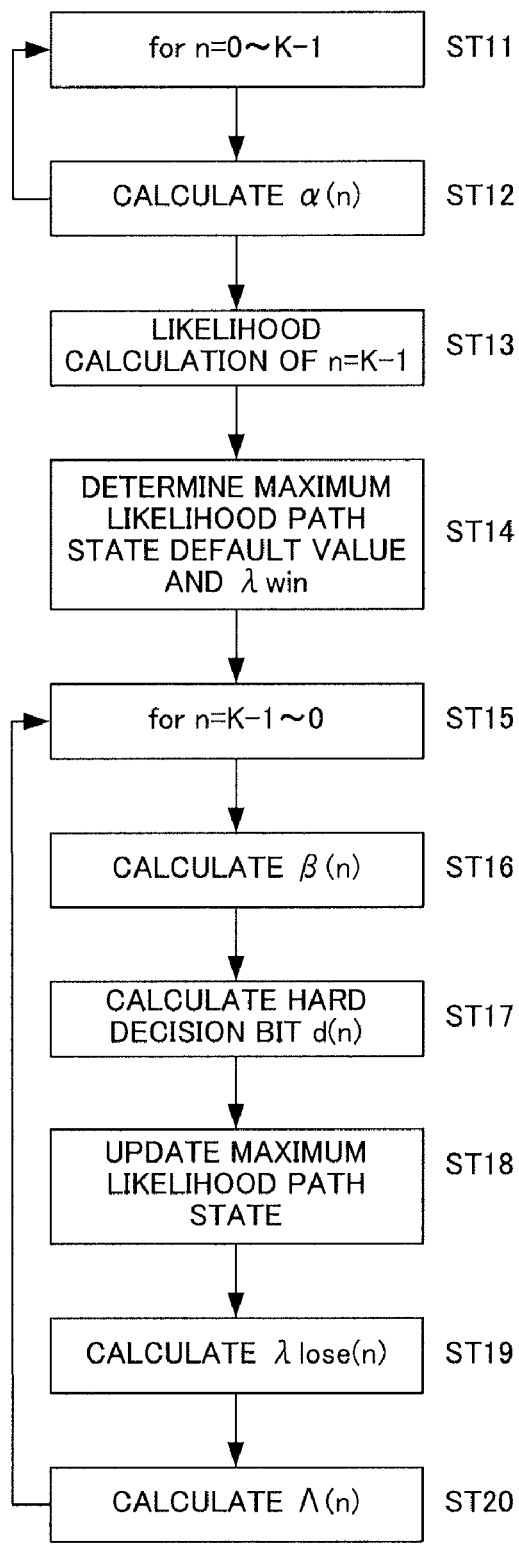
FIG. 13 is a flowchart illustrating processing of soft output decoding in the soft output decoder according to above Embodiment 1.

FIG. 13 is a flowchart illustrating processing of soft output decoding in soft output decoder 100. In this figure, "ST" refers to each step in the flowchart, and processing is carried out in order from step ST11 to step ST20.

First, α(n) is calculated for n=K−1 to 0 in steps ST11 and ST12. Here, calculation of α(n) means calculating eight values of α0(n) to α7(n). Calculated α(n) is stored in timing adjuster (i.e. the FILO memory) 102. α calculation in γα calculating section 101 is carried out in the same way as a conventional art.

Steps ST13 and ST14 are boundary processing in <algorithm 1-A-1>. The boundary processing is carried out in losing likelihood calculating section 112, the determined maximum likelihood path state is stored in hard decision decoding section 111 and λwin is stored in winning likelihood storing section 113.

Next, β(n) is calculated for n=K−1 to 0 in steps ST15 and ST16. β calculation in γβ calculating section 104 is carried out in the same way as a conventional art.

In step ST17, hard decision decoding section 111 calculates the hard decision bit d(n). Hard decision decoding section 111 calculates the hard decision value d(n) (corresponding to the type of the maximum likelihood branch) according to above (1-2) of <algorithm 1-A>.

In step ST18, hard decision decoding section 111 updates the maximum likelihood path state. Hard decision decoding section 111 specifies the next maximum likelihood path state according to above (1-3) of <algorithm 1-A>.

In step ST19, losing likelihood calculating section 112 calculates λlose(n) according to above (2) of <algorithm 1>.

Next, in step ST20, Λ(n) is calculated and the flow returns to above step ST15. By specifying the associations between λwin (n), λlose (n), λ0(n) and λ1(n) based on the hard decision value d(n), Λ(n)=λ0(n)−λ1(n) is calculated. This calculation is carried out by subtractor 114 with the sign operation functions.

Next, each block of soft output decoder 100 will be described.

[Losing Likelihood Calculating Section 112]

Losing likelihood calculating section 112 included in Λ calculating section 110 has following two functions. (1) Calculating λlose(n) in above step ST19. (2) Finding λwin and the maximum likelihood path state in above steps ST13 and ST14.

Of these, the main function of losing likelihood calculating section 112 is the processing of λlose(n) calculation in the above step of ST19. In view of the above, the functions of above (2) and (3) of <algorithm 1-A-1> can be realized by appropriating losing likelihood calculating section 112, so that this is employed with the present embodiment.

First, losing likelihood calculating section 112 that realizes only above step ST19 will be described.

Losing likelihood calculating section 112 calculates λlose(n) which is a value of either $\lambda_0(n)$ and $\lambda_1(n)$ having a smaller likelihood (a larger value). Which one of two likelihoods $\lambda_0(n)$ and $\lambda_1(n)$ is smaller is decided based on the output d(n) from hard decision decoding section 111. When the hard decision output d(n) is 1, $\lambda_0(n) > \lambda_1(n)$ holds and so the likelihood value λ0(n) is calculated, and, when the hard decision output d(n) is 1, the likelihood value $\lambda_1(n)$ is calculated. The calculated value is inputted to subtractor 114.

The above processing can be represented by following equation 10.

(Equation 10)
if (d(n) = 0){                                                          [3]

$$\lambda_{lose}(n) = \min\{ \alpha_0(n) + \beta_1(n) + \gamma_{11}(n),$$
$$\alpha_1(n) + \beta_3(n) + \gamma_{10}(n),$$
$$\alpha_2(n) + \beta_4(n) + \gamma_{10}(n),$$
$$\alpha_3(n) + \beta_6(n) + \gamma_{11}(n),$$
$$\alpha_4(n) + \beta_0(n) + \gamma_{11}(n),$$
$$\alpha_5(n) + \beta_2(n) + \gamma_{10}(n),$$
$$\alpha_6(n) + \beta_5(n) + \gamma_{10}(n),$$
$$\alpha_7(n) + \beta_7(n) + \gamma_{11}(n)\}$$

}else {
$$\lambda_{lose}(n) = \min\{ \alpha_0(n) + \beta_0(n) + \gamma_{00}(n),$$
$$\alpha_1(n) + \beta_2(n) + \gamma_{01}(n),$$
$$\alpha_2(n) + \beta_5(n) + \gamma_{01}(n),$$
$$\alpha_3(n) + \beta_7(n) + \gamma_{00}(n),$$
$$\alpha_4(n) + \beta_1(n) + \gamma_{00}(n),$$
$$\alpha_5(n) + \beta_3(n) + \gamma_{01}(n),$$
$$\alpha_6(n) + \beta_4(n) + \gamma_{01}(n),$$
$$\alpha_7(n) + \beta_6(n) + \gamma_{00}(n)\}$$

}

Figure 14:
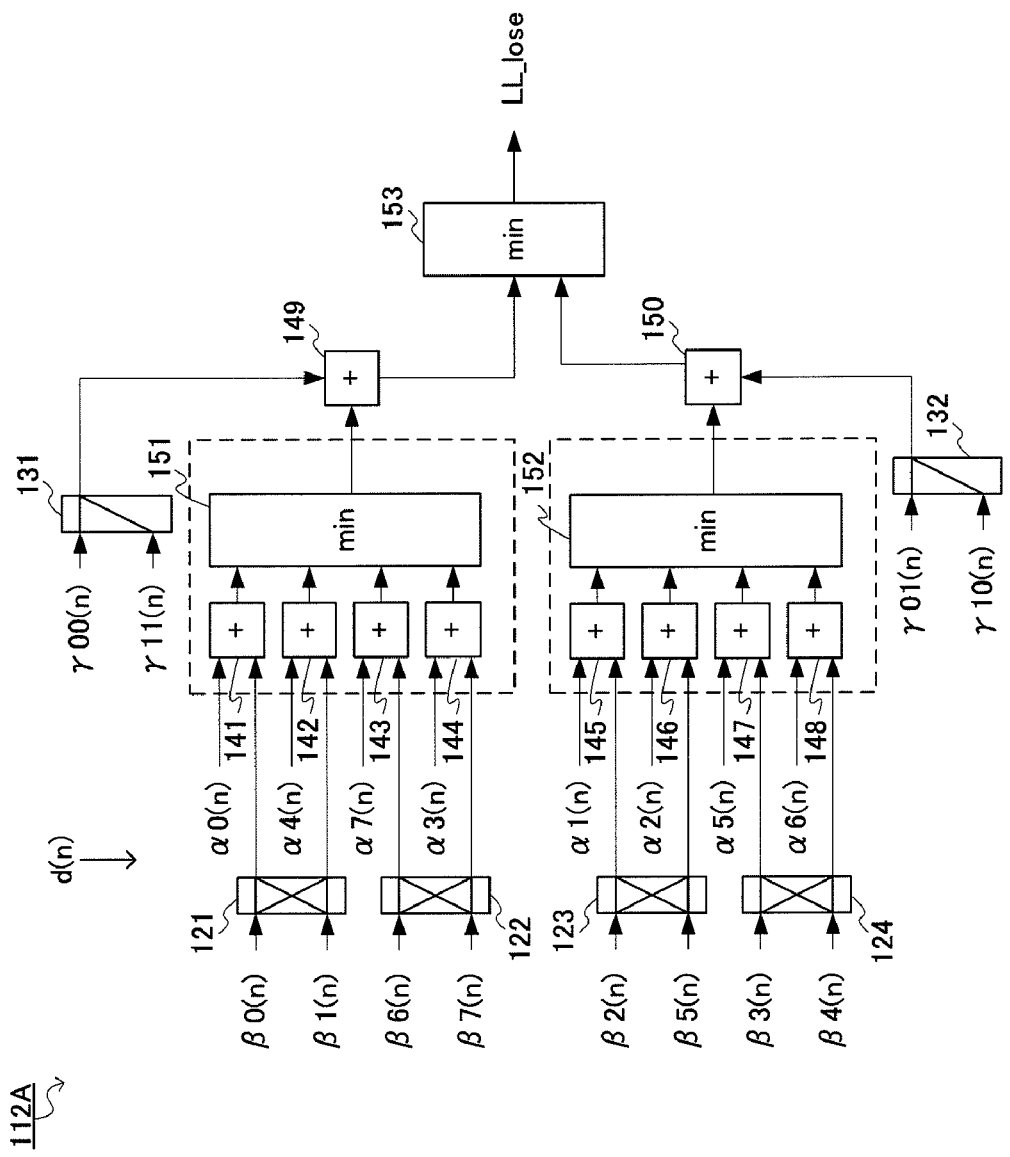
FIG. 14 shows a configuration of losing likelihood calculating section of the soft output decoder according to above Embodiment 1.

FIG. 14 shows a configuration of losing likelihood calculating section 112 of soft output decoder 100. Further, FIG. 14 shows an example of implementation for illustrating the function of losing likelihood calculating section 112, and the best mode configuration thereof will be described with reference to FIG. 16.

In FIG. 14, losing likelihood calculating section 112A is configured with switches 121 to 124, selectors 131 and 132, adders 141 to 150 and minimum value selectors (min) 151 to 153.

FIG. 15 illustrates operations of above switches 121 to 124 and selectors 131 to 132, and FIG. 15A and FIG. 15B show the operations of switches 121 to 124 and FIG. 15C and FIG. 15D show the operations of selectors 131 and 132.

In FIG. 15A and FIG. 15B, if switch 121 is described as a representative, switch 121 outputs two items of data forward when d(n)=1 and switches the two data positions and output data when d(n)=0.

Further, in FIG. 15C and FIG. 15D, if selector 131 is described as a representative, selector 131 outputs data in the upper part of the figure when d (n)=1 and outputs data in the lower part in the figure when d(n)=0.

The above function corresponds to "calculation of λlose" of step ST19 in the flowchart of FIG. 13.

Next, the method of realizing processing of finding λwin and the maximum likelihood path state in steps ST13 and ST14 in the flowchart of FIG. 13 will be described.

Figure 16:
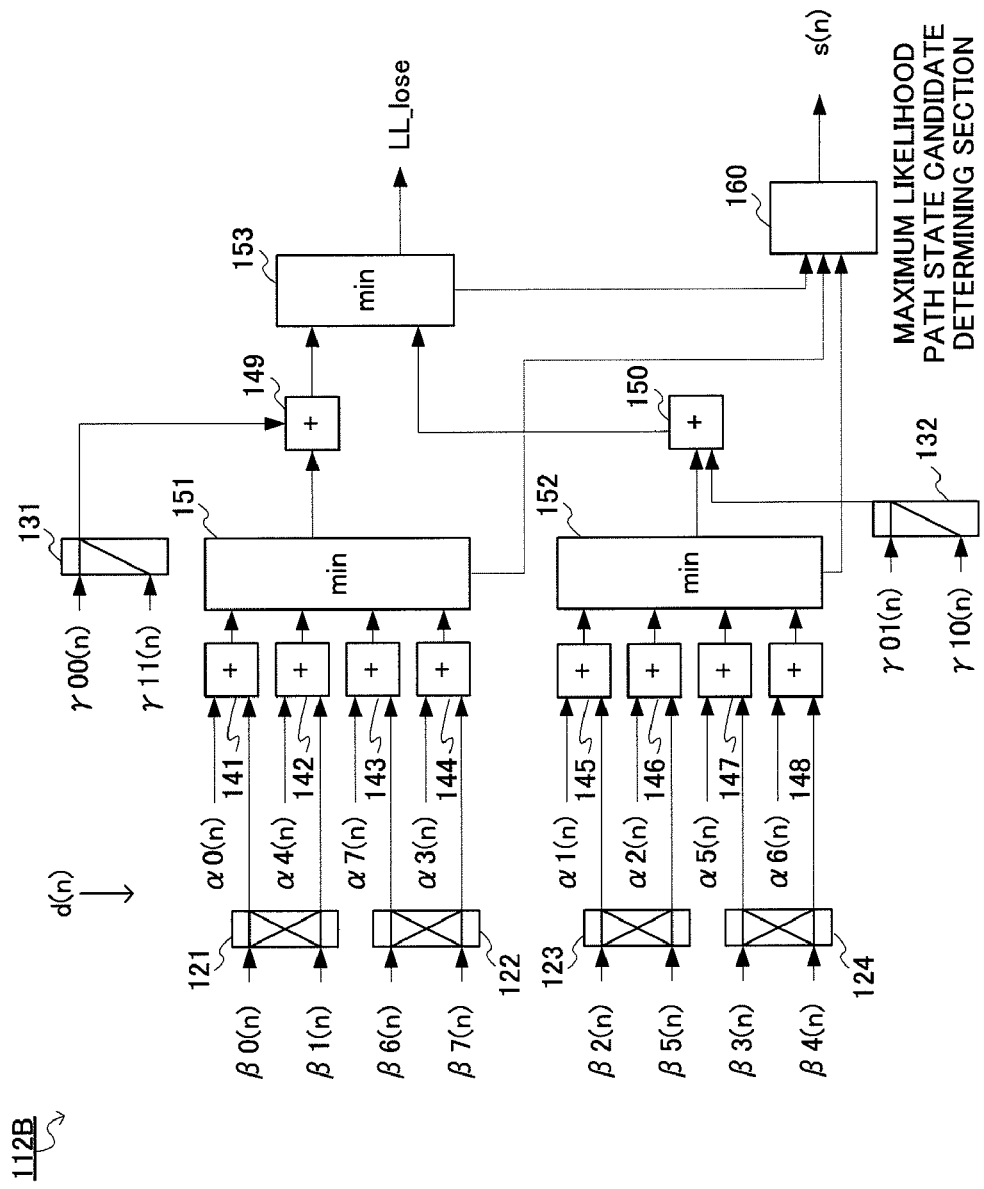
FIG. 16 shows a configuration of an example of implementation of the losing likelihood calculating section of the soft output decoder according to Embodiment 1 of the present invention.

FIG. 16 shows a configuration of an example of implementation of losing likelihood calculating section 112 of soft output decoder 100. FIG. 16 shows the best mode configuration of losing likelihood calculating section 112A of FIG. 14. The same configuration parts as in FIG. 14 are assigned the same reference numerals.

In FIG. 16, losing likelihood calculating section 112B is configured with switches 121 to 124, selectors 131 and 132, adders 141 to 150, minimum value selectors (min) 151 to 153 and maximum likelihood path state candidate determining section 160.

As shown in FIG. 16, there are three minimum value selectors (min) 151 to 153 inside losing likelihood calculating section 112B. These minimum value selectors 151 to 153 are provided with terminals outputting signals showing which values are selected.

For example, when d (n)=1, although minimum value selector (min) 151 selects the minimum value from $\alpha 0(n)+\beta 0(n)$, $\alpha 4(n)+\beta 1(n)$, $\alpha 7(n)+\beta 6(n)$ and $\alpha 3(n)+\beta 7(n)$, if $\alpha 4(n)+\beta 1(n)$ is selected, the value "4" showing that the value related to $\alpha 4(n)$ has been selected, is outputted to maximum likelihood path state candidate determining section 160.

Maximum likelihood path state candidate determining section 160 outputs the signal s(n) showing which value is finally selected. For example, when LL_lose=$\alpha 2(n)+\beta 4(n)+\gamma 10(n)$ is selected, s(n)=2 is outputted.

Steps of finding λwin and the maximum likelihood path state using this losing likelihood calculating section 112B will be described.

Figure 17:
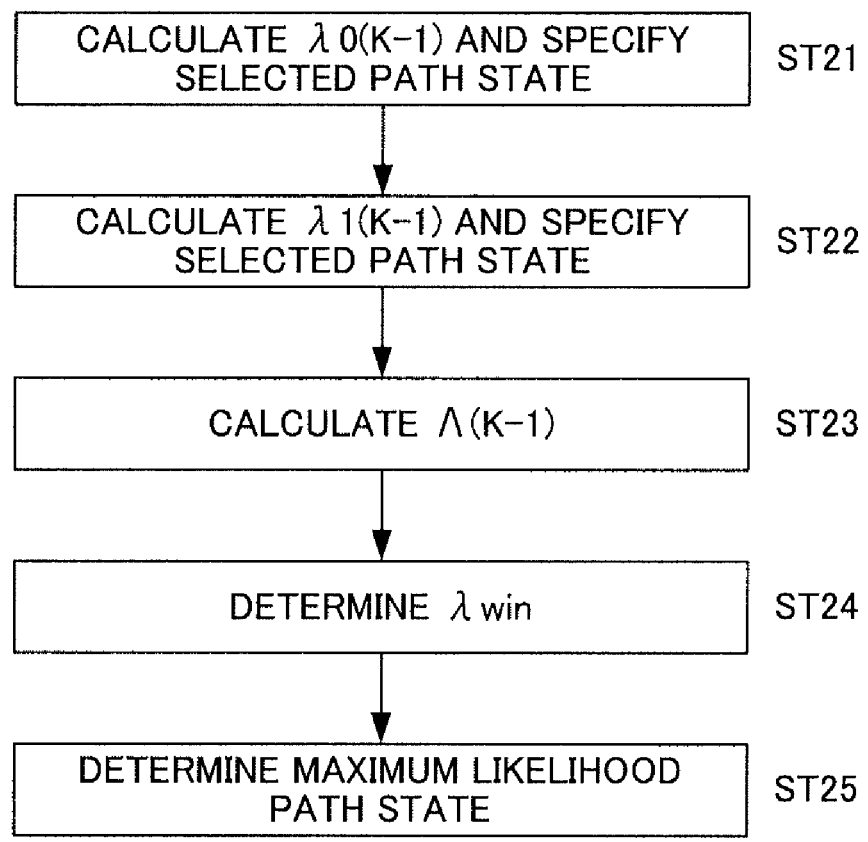
FIG. 17 is a flowchart showing processing of calculating $\lambda$win and the maximum likelihood path state by the losing likelihood calculating section of the soft output decoder according to Embodiment 1 of the present invention.

FIG. 17 is a flowchart showing processing of calculating λwin and the maximum path state by losing likelihood calculating section of FIG. 16, and processing is carried out in order from step ST21 to step ST25.

Step ST21 to step ST23 correspond to step ST13 in FIG. 13 and step ST24 to step 25 correspond to processing of step ST14 of FIG. 13.

First, λ0 (K−1) is determined in step ST21 by fixing d(n)=1 in losing likelihood calculating section 112B. This value is stored in winning likelihood storing section 113 as a provisional winning likelihood λwin. Further, the maximum likelihood path state candidate s(n) in this case is transmitted to hard decision decoding section 111 (see FIG. 12) as a provisional maximum likelihood path state initial value.

λ1 (K−1) is determined in step ST22 by fixing d(n)=0 in losing likelihood calculating section 112B. This is made the provisional λlose.

In step ST23, subtractor 114 calculates the difference between the provisional λwin and provisional λlose. This calculation result is the decoding result of n=K−1, Λ(K−1).

In step ST24, the sign of Λ(K−1) is decided, and, if the likelihood of the provisional λwin (λ0 (K−1)) is higher (Λ(K−1)>0), the provisional λwin is the true λwin, and so the λwin stored in step ST21 is left as is. On the other hand, if the likelihood of λlose (λ1(K−1)) is higher (Λ(K−1)>0), the provisional λlose is the true λwin. Then, the provisional λlose outputted from losing likelihood calculating section 112B is stored in winning likelihood storing section 113 (see FIG. 12).

Similar to processing in step ST24, in step ST25, if the likelihood of λlose is decided to be higher, a signal to update the value of s (n) is transmitted to hard decision decoding section 111.

Next, hard decision decoding section 111 will be described. Hard decision decoding section 111 realizes <algorithm 1-A>.

[Hard Decision Decoding Section 111]

Figure 18:
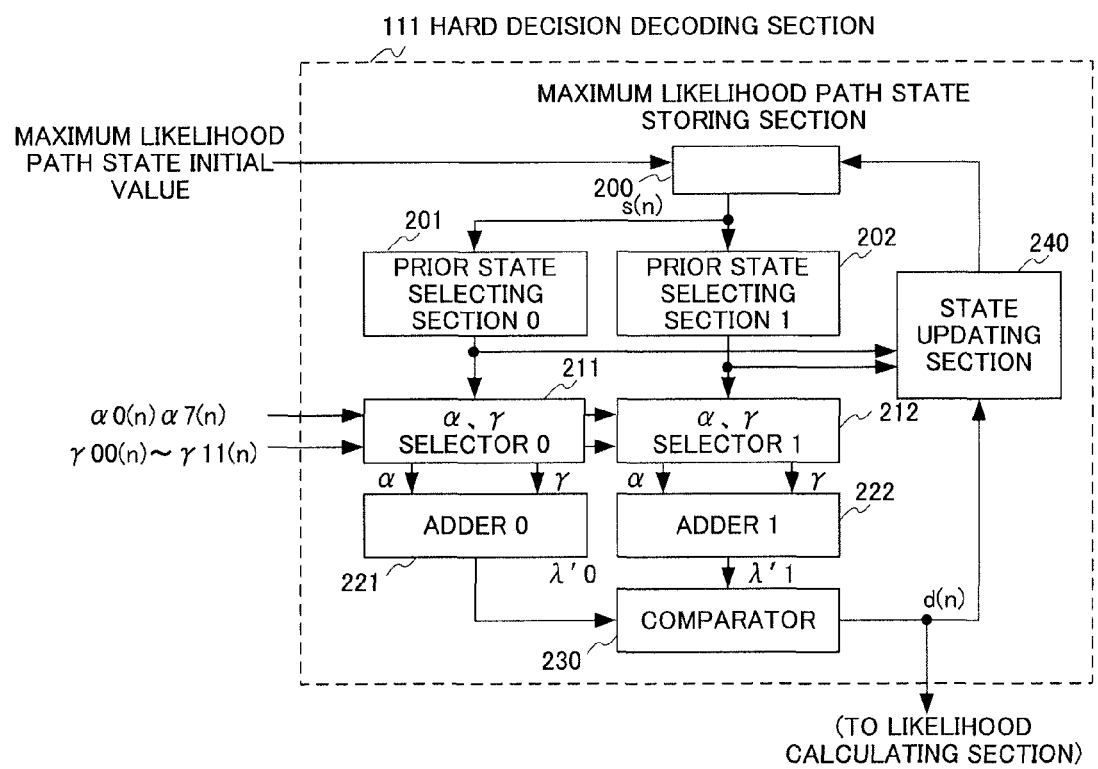
FIG. 18 is a block diagram showing a configuration of a hard decision decoding section of the soft output decoder according to Embodiment 1 of the present invention.
Figure 19:
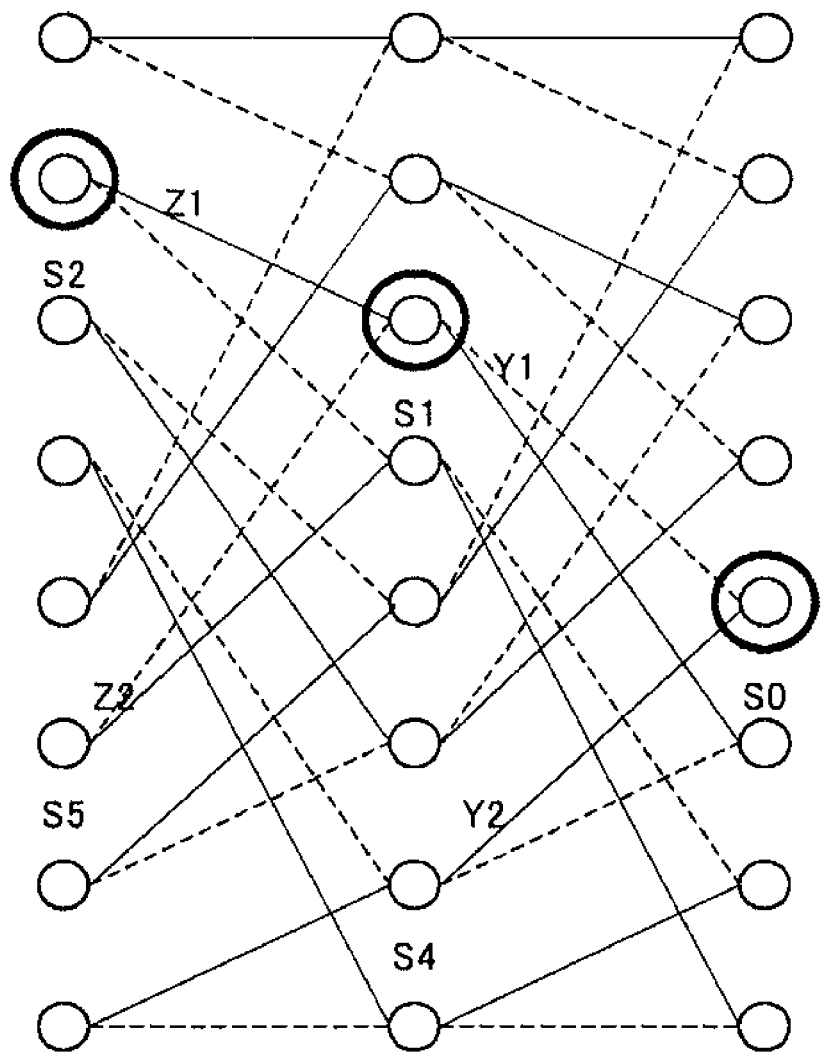
FIG. 19 is a trellis diagram illustrating the function of the hard decision decoding section of the soft output decoder according to Embodiment 1 of the present invention.

FIG. 18 is a block diagram showing a configuration of hard decision decoding section 111 of soft output decoder 100, and FIG. 19 is a trellis diagram illustrating the function of hard decision decoding section 111.

In FIG. 18, hard decision decoding section 111 is configured with maximum likelihood path state storing section 200, prior state selecting sections 201 and 202 (prior state selecting sections 0 and 1), αγ selectors 211 and 212, adders 221 and 222, comparator 230 and state updating section 240.

As shown in FIG. 19, maximum likelihood path state storing section 200 holds the present maximum likelihood path state number (S0).

Prior state selecting section 201 (prior state selecting section 0) finds the state number (S4) connected with the present maximum likelihood path state number (S0) by a solid line. Further, prior state selecting section 202 (prior state selecting section 1) finds the state number (S1) connected with the present maximum likelihood path state number (S0) by a broken line.

αγ selectors 211 and 212 select the α of the state number selected by prior state selecting section 201 (prior state selecting section 0) and the γ corresponding to the α, from inputted eight α's and four γ's ($\alpha 6(n)$ and $\gamma 01(n)$).

Adders 221 and 222 add outputs of αγ selector 211 (αγ selector 0) ($\lambda'0(n)=\alpha 6(n)+\gamma 01(n)$).

Comparator 230 compares the outputs of two adders 221 and 222. If $\lambda'0(n)>\lambda'1(n)$, d(n)=0 is outputted, and otherwise, d(1)=1 is outputted.

The above is the maximum likelihood branch specifying processing corresponding to above (1-2) of <algorithm 1-A>.

Further, state updating section 240 selects the state number finally decided by comparator 230 to have the higher likelihood in outputs of two prior state selecting sections 201 and 202, and transmits the state number to maximum likelihood path state storing section 200.

For example, if d(n)=0 is decided, the output of prior state selecting section 201 (prior state selecting section 0) is transmitted as a new maximum likelihood path state to maximum likelihood path state storing section 200.

As described above, according to the present embodiment, a plurality of likelihoods determined in the Max-log-MAP decoder are identified as either winning likelihoods or losing likelihoods and only the losing likelihoods are calculated, so that two likelihood calculating section required conventionally can be reduced to one and the circuit scale and power consumption can be reduced.

Further, hard decision decoding section 111 that sequentially specifies the states through which the maximum likelihood path passes is used for the method of identifying winning likelihoods and losing likelihoods, so that the Max-log-MAP decoder does not require a large circuit additionally and can be realized with a simple configuration.

Further, hard decision decoding section 111 employs the same method as general Max-log-MAP in the boundary between data processing units such as the end of data and carries subsequent processings with the above simple method using the result of Max-log-MAP as the initial value, so that exactly the same result as in Max-log-MAP decoding can be acquired with a small circuit scale and little power consumption.

As shown in the following table, compared to the conventional Max-log-MAP decoding method shown in the table of FIG. 4, the present embodiment makes it possible to reduce the amount of operation significantly. The numbers in parentheses in the table are the differences from a conventional number of operations.

[Table 1]

Embodiment 2

An example of implementation of <algorithm 1-B> described in (basic principle) will be described with the present embodiment.

Figure 20:
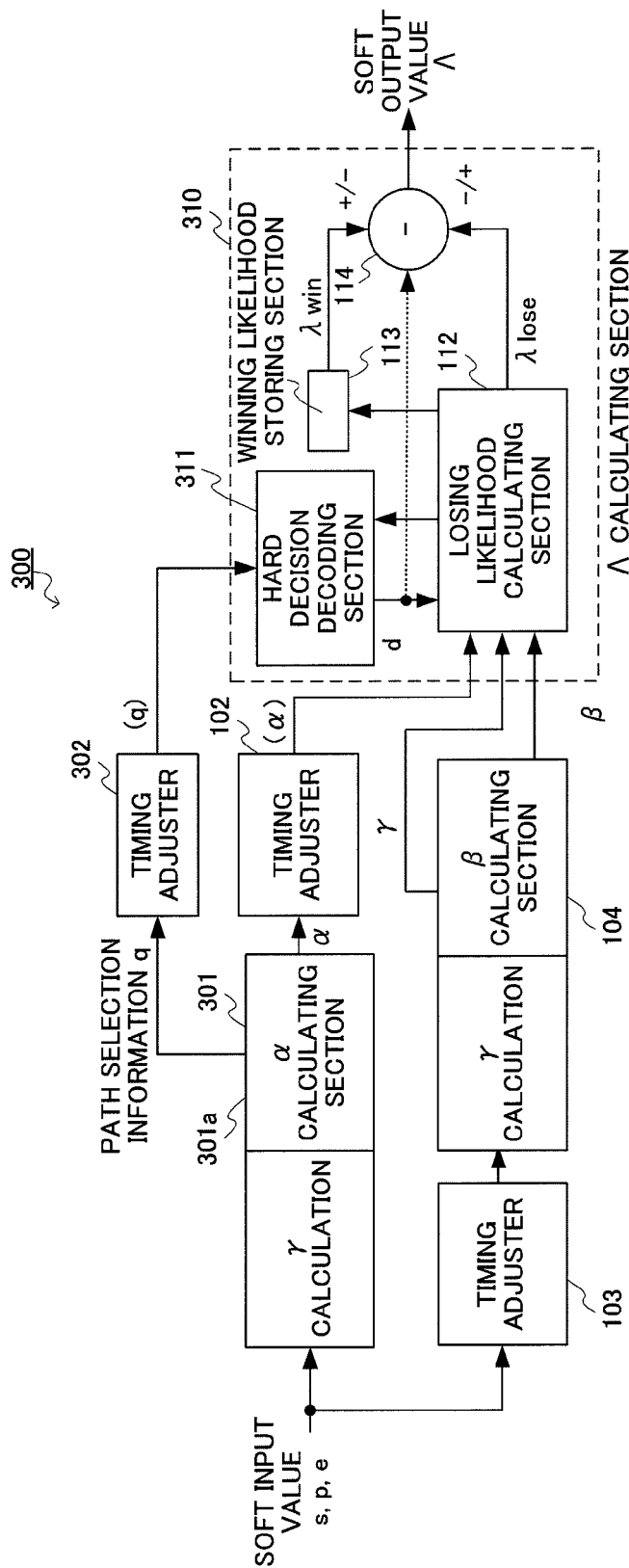
FIG. 20 is a block diagram showing a schematic configuration of the soft output decoder according to Embodiment 2 of the present invention.

FIG. 20 is a block diagram showing a schematic configuration of the soft output decoder according to Embodiment 2 of the present invention. To describe the present embodiment, the same parts as in FIG. 12 will be assigned the same reference numerals and repetition of description will be omitted.

In FIG. 20, soft output decoder 300 is configured with γα calculating section 301, timing adjusters 102, 103 and 302 composed of FILO memories, γβ calculating section 104 and Λ calculating section 310. Λ calculating section 310 is composed of hard decision decoding section 311, losing likelihood calculating section 112, winning likelihood calculating section 113 and subtractor 114.

The difference from soft output decoder 100 of Embodiment 1 is as follows.

In soft output decoder 300 of the present embodiment, α calculating section 301a of γα calculating section 301 is configured to output path selection information q. Path selection information q is inputted to hard decision decoding section 311 by adjusting the timing by timing adjuster 302 composed of the FILO memory.

Further, the internal configuration of hard decision decoding section 311 in Λ calculating section 310 is different. The α and γ need not to be inputted to hard decision decoding section 311.

Figure 21:
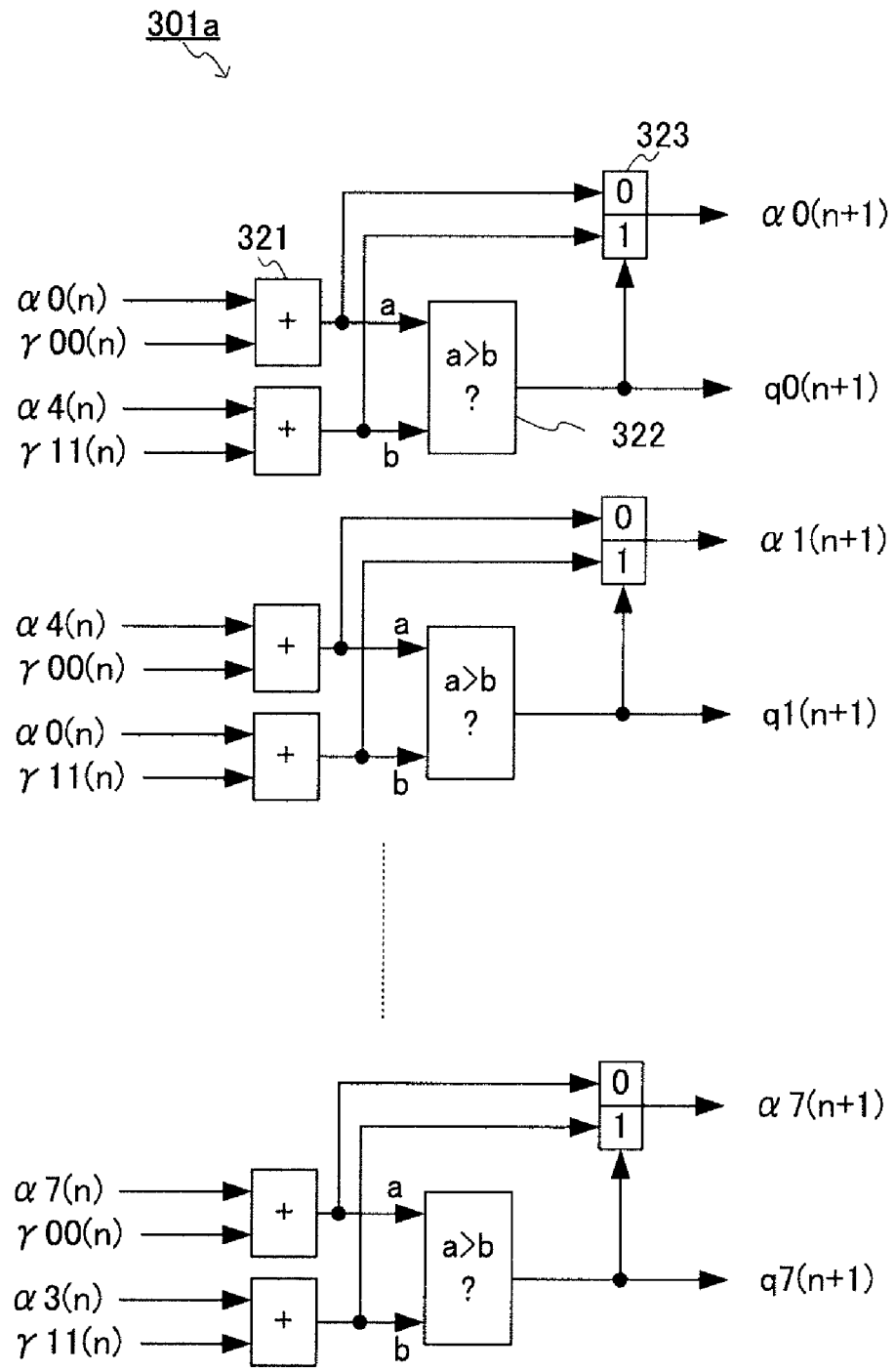
FIG. 21 is a block diagram showing a configuration of an $\alpha$ calculating section of a $\gamma\alpha$ calculating section of the soft output decoder according to above Embodiment 2.

FIG. 21 is a block diagram showing a configuration of α calculating section 301a of γα calculating section 301.

In FIG. 21, calculating section 301a is configured with adder 321, size comparator 322 and selector 323.

α calculating section 301a is an α calculating block and carries out calculation based on above equation 5. For two inputs a and b, size comparator 322 and selector 323 output "b" if a>b and outputs "a" otherwise.

As the value of q, 0 is outputted when the branch related to γ00 or γ01 is selected and 1 is outputted when the branch related to γ10 or γ11 is selected.

Figure 22:
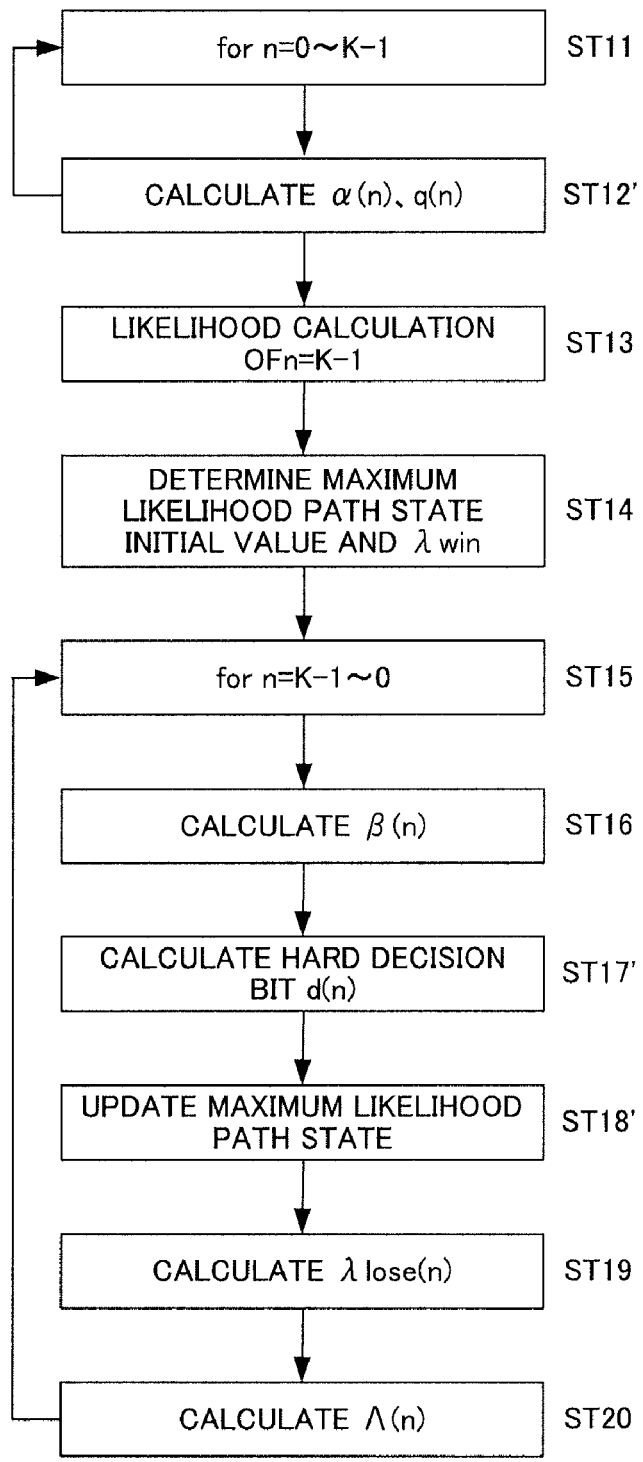
FIG. 22 is a flowchart illustrating processing of soft output decoding in the soft output decoder according to above Embodiment 2.

FIG. 22 is a flowchart illustrating processing of soft output decoding in soft output decoder 300. In steps in Embodiment 2 shown in FIG. 22, processings are carried out in basically the same steps as processing corresponding to Embodiment 1 shown in FIG. 13, and the same processings will be assigned same step numbers and only different steps will be described.

The overall processing flow is almost the same. In α calculation, different steps which are assigned "'" are step ST12' for outputting q(n), step ST17' of the calculating method for the hard decision bit d(n) and step ST18' of the maximum likelihood updating method.

Figure 23:
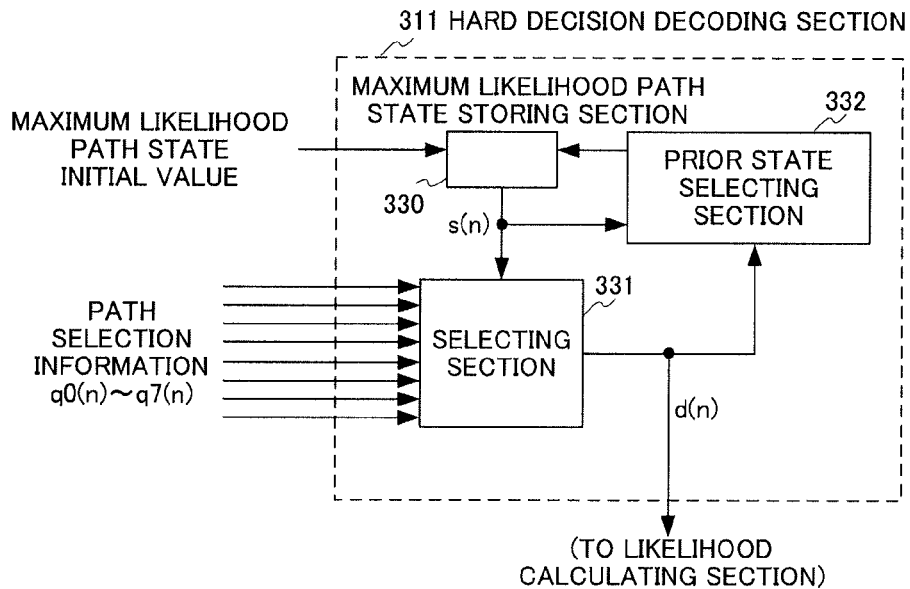
FIG. 23 is a block diagram showing a configuration of the hard decision decoding section of the soft output decoder according to above Embodiment 2.
Figure 24:
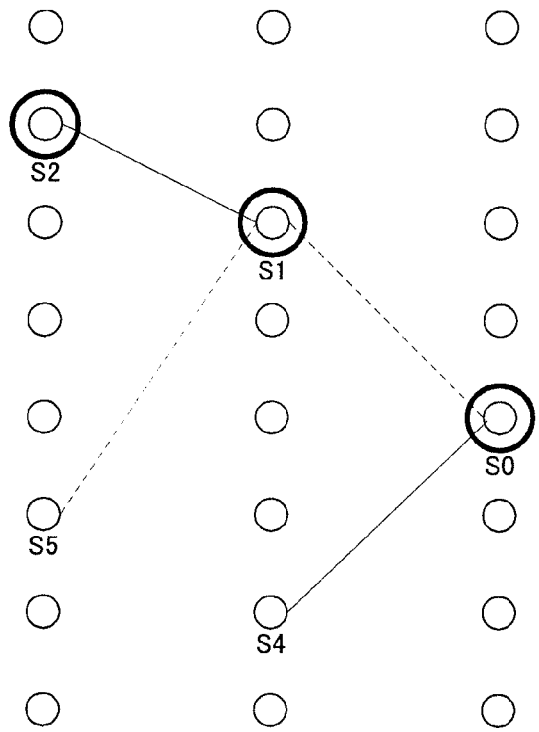
FIG. 24 is a trellis diagram illustrating the operation of the hard decision decoding section of the soft output decoder according to above Embodiment 2.

FIG. 23 is a block diagram showing a configuration of hard decision decoding section 311 and FIG. 24 is a trellis diagram illustrating the operation of hard decision decoding section 311.

In FIG. 23, hard decision decoding section 311 is configured with maximum likelihood path state storing section 330, selecting section 331, and prior state selecting section 332.

As shown in FIG. 24, selecting section 331 selects one value corresponding to the maximum likelihood path state from eight items of path selection information q0($n$) to q0(7) and outputs the result to losing likelihood calculating section 112 and prior state selecting section 332. This value is made d(n).

Prior state selecting section 332 specifies state numbers ahead of the maximum likelihood branch according to the hard decision value d(n). Further, the configuration of losing likelihood calculating section 112, which is the feature of the present invention, is exactly the same as in Embodiments 1 and 2.

Furthermore, the principle of the present invention is applicable to the "sliding window scheme" and "subblock dividing scheme" known as schemes for efficient implementation of Max-log-MAP decoding, so that the amount of operation for likelihood calculation can be reduced without producing calculation errors.

Further, the principle of the present invention is applicable to general turbo code, and can be appropriated for, for example, turbo code referred to as "Duo-Binary Turbo" different from Non-Patent Document 1. That is, when there are two or more types of branches, one maximum likelihood branch is specified and likelihood calculation for the same type of branches as the maximum likelihood branch is omitted.

A case will be described below with Embodiment 3 as an example where the present invention is applied to the "sliding window scheme."

Embodiment 3

A case will be described with the present embodiment where the above basic principle is applied to the "sliding window" scheme.

First, the sliding window scheme will be described.

The sliding window scheme is directed to dividing the data sequence of length K into small blocks (i.e. windows) of length L (L<K) and carries out α calculation, β calculation and Λ calculation, per window (see Non-Patent Document 1). According to the sliding window scheme, α calculation and β calculation can be parallelized, thereby speeding up decoding processing, and the volume of a memory of the timing adjuster requires only the window length, thereby reducing the amount of memory.

Next, the calculation steps of the sliding window scheme will be described.

Figure 25A:
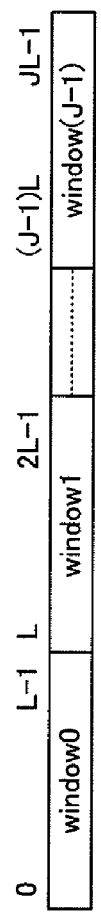
FIG. 25 illustrates calculation steps according to a sliding window scheme.
Figure 25B:
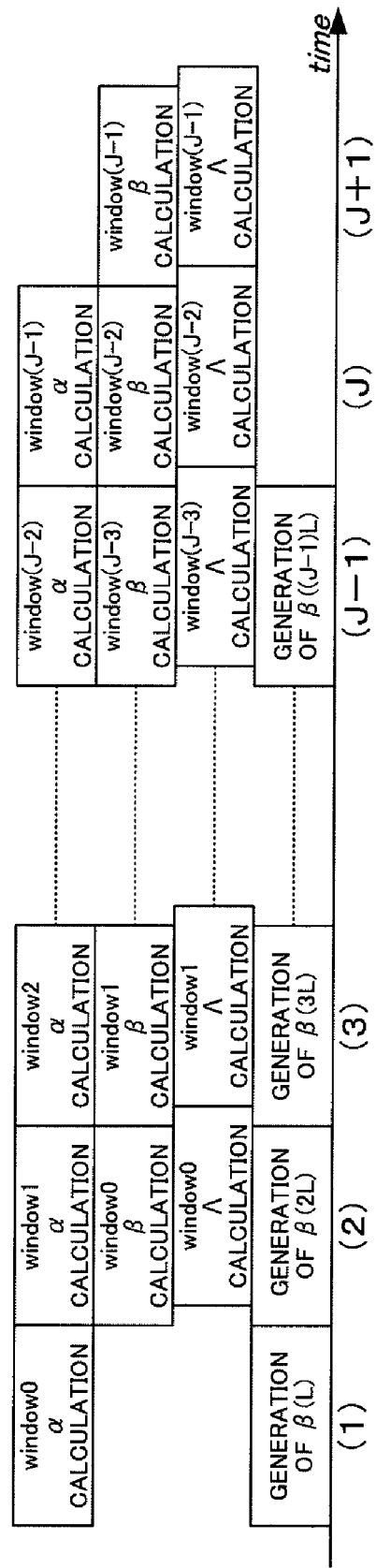

FIG. 25 illustrates the calculation steps of the sliding window scheme, and FIG. 25A shows an example of the data sequence divided into a plurality of windows and FIG. 25B shows operation timings in the sliding window scheme corresponding to the data sequence of FIG. 25A.

As shown in FIG. 25A, as to the target data sequence, the window length is L and the number of windows is J. Here, for ease of description, a fraction is not produced as in K=JL. Further, even if a fraction is produced, there is no significant difference in the steps.

As shown in FIG. 25B, first, α calculation is carried out for window 0 (see the step (1) of FIG. 25B).

After α calculation for window 0 is finished, next, α calculation is carried out for window 1 and β calculation is carried out for window 0 at the same time. When β starts being outputted from the β calculating section, Λ calculation is carried out following β calculation (see the step (2) of FIG. 25B).

By the way, calculation of β(n) is sequentially carried out for n=K−1 to 0 using β (K−1) as the initial value. The value of β (L) is required as the initial value to carry out β calculation for window 0.

Then, while carrying out α calculation for window 0 in step (1) shown in FIG. 25B, β(L) is determined by some method. As disclosed in Non-Patent Document 1, some methods are known as the method of deriving the value of the β in the window boundary such as this β(L).

When α calculation for all windows (window 0 to window (J−1)) is finished, β calculation and Λ calculation are finished after time delay of one window.

As described above, according to the sliding window scheme, by carrying out α calculation, β·Λ calculation and derivation of the β boundary value in parallel, Max-log-MAP decoding is carried out at high speed.

Figure 26:
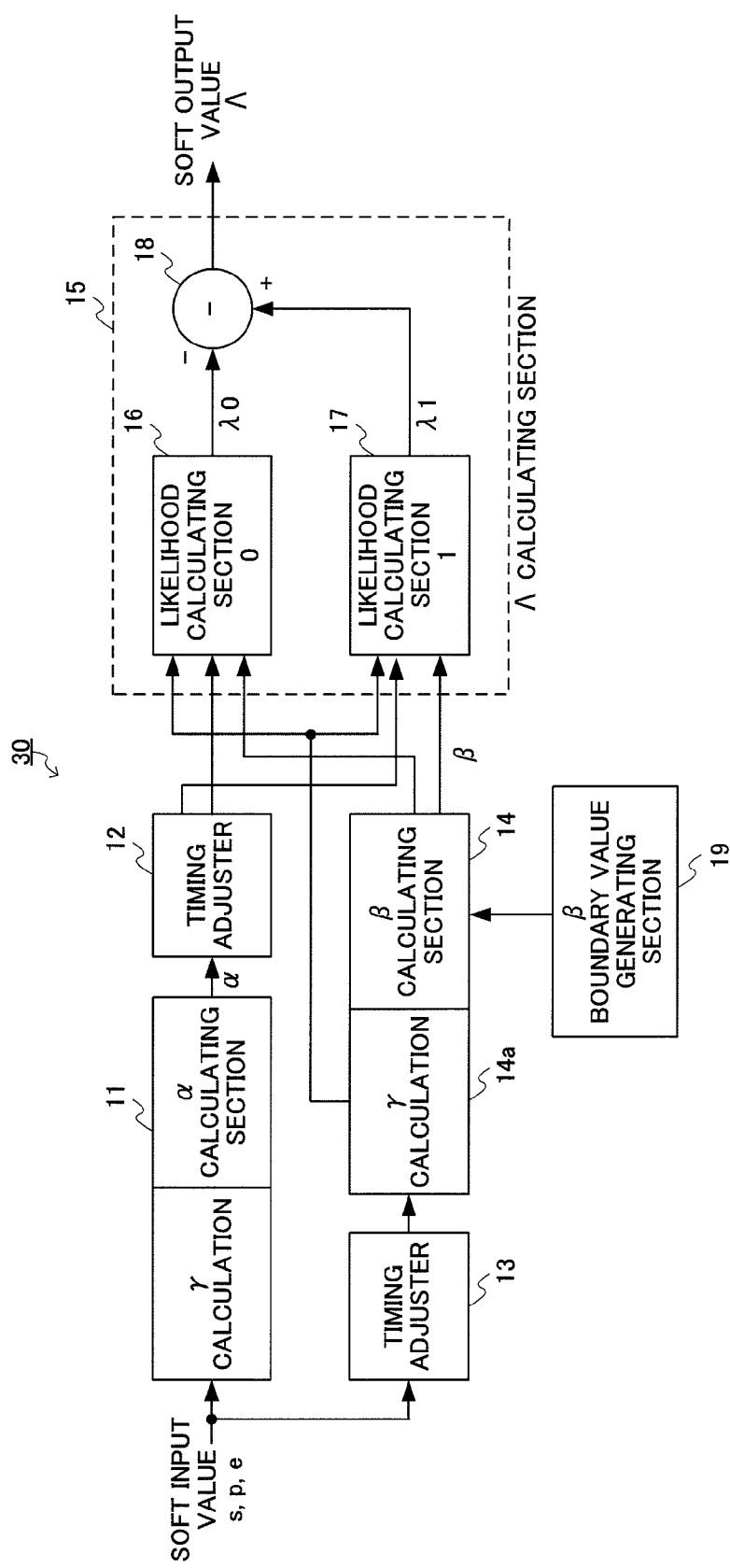
FIG. 26 is a block diagram showing a basic configuration of a decoder that realizes the sliding scheme.

FIG. 26 is a block diagram showing a basic configuration of a decoder that realizes the sliding scheme. Decoder 30 shown in FIG. 26 adds only β boundary value generating section 19 to the configuration of conventional Max-log-MAP decoder 1 shown in FIG. 29, and the configurations are almost the same and, as described above, only operation timings are different.

Figure 27:
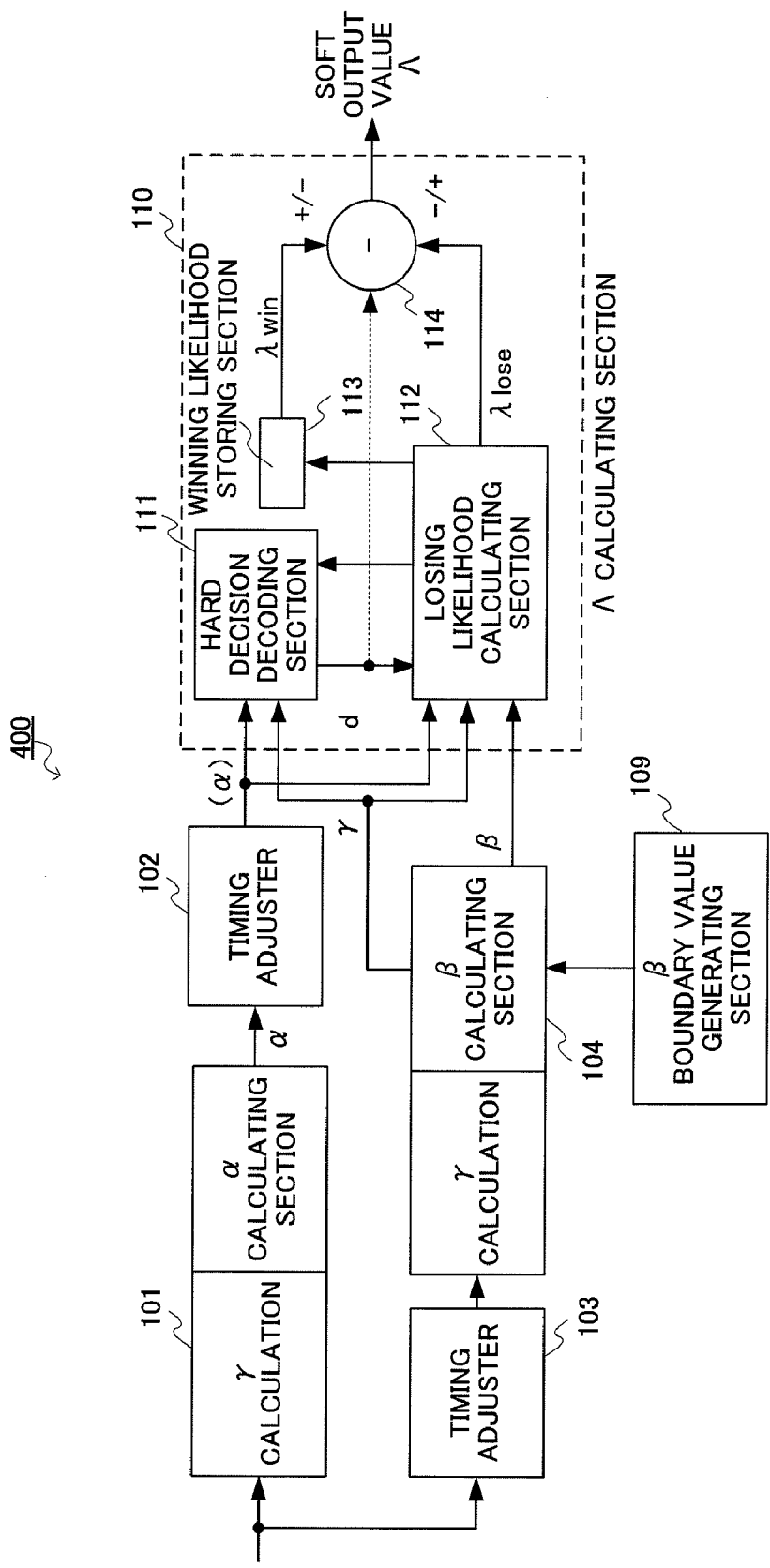
FIG. 27 is a block diagram showing a schematic configuration of the soft output decoder according to Embodiment 3 of the present invention.

FIG. 27 shows an example where the principle of the present invention is applied to the decoder of the sliding scheme having such a basic configuration.

FIG. 27 is a block diagram showing a schematic configuration of the soft output decoder according to Embodiment 3 of the present invention. The same components as in soft output decoder 100 of FIG. 12 will be assigned the same reference numerals and repetition of description will be omitted.

In FIG. 27, soft output decoder 400 is configured with γα calculating section 101, timing adjusters 102 and 103 composed of FILO memories, γβ calculating section 104, β boundary value generating section 109 and Λ calculating section 110. Λ calculating section 110 is composed of hard decision decoding section 111, losing likelihood calculating section 112, winning likelihood storing section 113 and subtractor 114.

β boundary value generating section 109 has the same function as β boundary value generating section 19 of FIG. 26.

Figure 28:
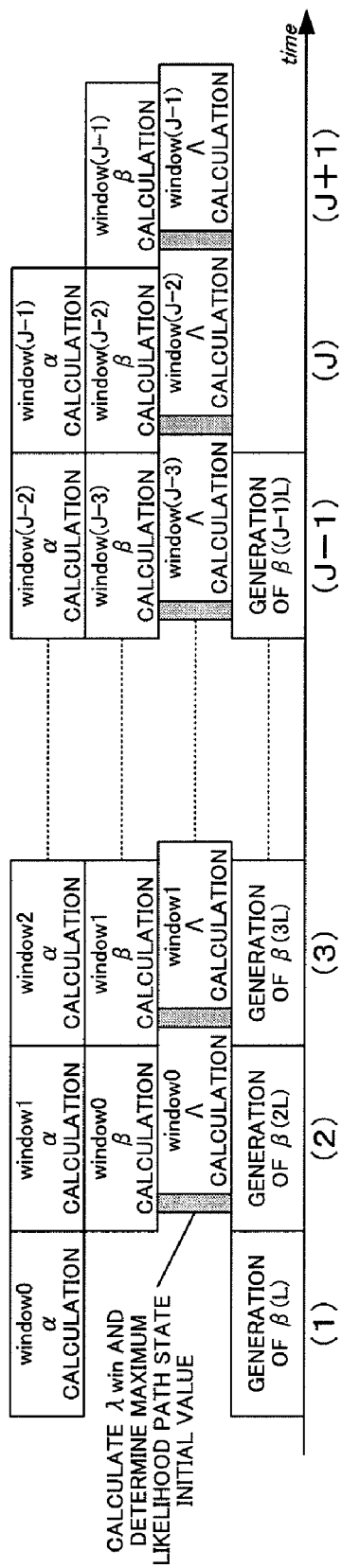
FIG. 28 shows operation timings of the soft output decoder according to above Embodiment 3.

FIG. 28 shows operation timings of soft output decoder 400.

As shown in FIG. 28, the operation timings do not change even if this soft output decoder 300 is applied to the sliding window scheme.

The principle of the present invention is applicable as is to the sliding window scheme. There are the following two points.

That is, the value of λwin may vary between windows, and so λwin is calculated every time calculation in a new window starts. In the calculation method, the same operation carried out for the tail of data (n=K−1) may be carried out in the window boundary such as n=L−1.

Further, the maximum likelihood path state initial value is derived every time calculation in a new window starts.

Particularly, soft output decoder 400 carries out Max-log-MAP processing (that is, calculates two likelihoods λ0(n) and λ1(n)) only in the window boundary and carries out hard decision decoding processing using the values determined then as the initial value (i.e. maximum likelihood path state initial value). By this means, according to the present embodiment, when window division processing is carried out, the same hard decision result as when general Max-log-MAP is carried out, can be acquired.

Further, other than the sliding window scheme, the principle of the present invention is applicable likewise as long as the processing streamlining technique of Max-log-MAP is based on data division. That is, by applying <algorithm 1-A-1> described in the basic principle of the present invention to one of both ends of divided data, soft decision decoding can be carried out in the same processing steps as in streamlined Max-log-MAP, so that the amount of operation can be reduced and power consumption can be decreased compared to the processing streamlining technique of conventional Max-log-MAP.

As an example of the processing streamlining technique of Max-log-MAP based on above data division, there is parallelization using subblock division. Parallelization using subblock division refers to dividing input data into a plurality of blocks and carrying out decoding each block. Further, sliding windowing is often carried out in each block.

Embodiment 4

A method of further reducing the amount of operation and power consumption when hard decision decoding is carried out using the soft output decoder of the above Embodiments 1 to 3 will be described with the present embodiment.

Figure 29:
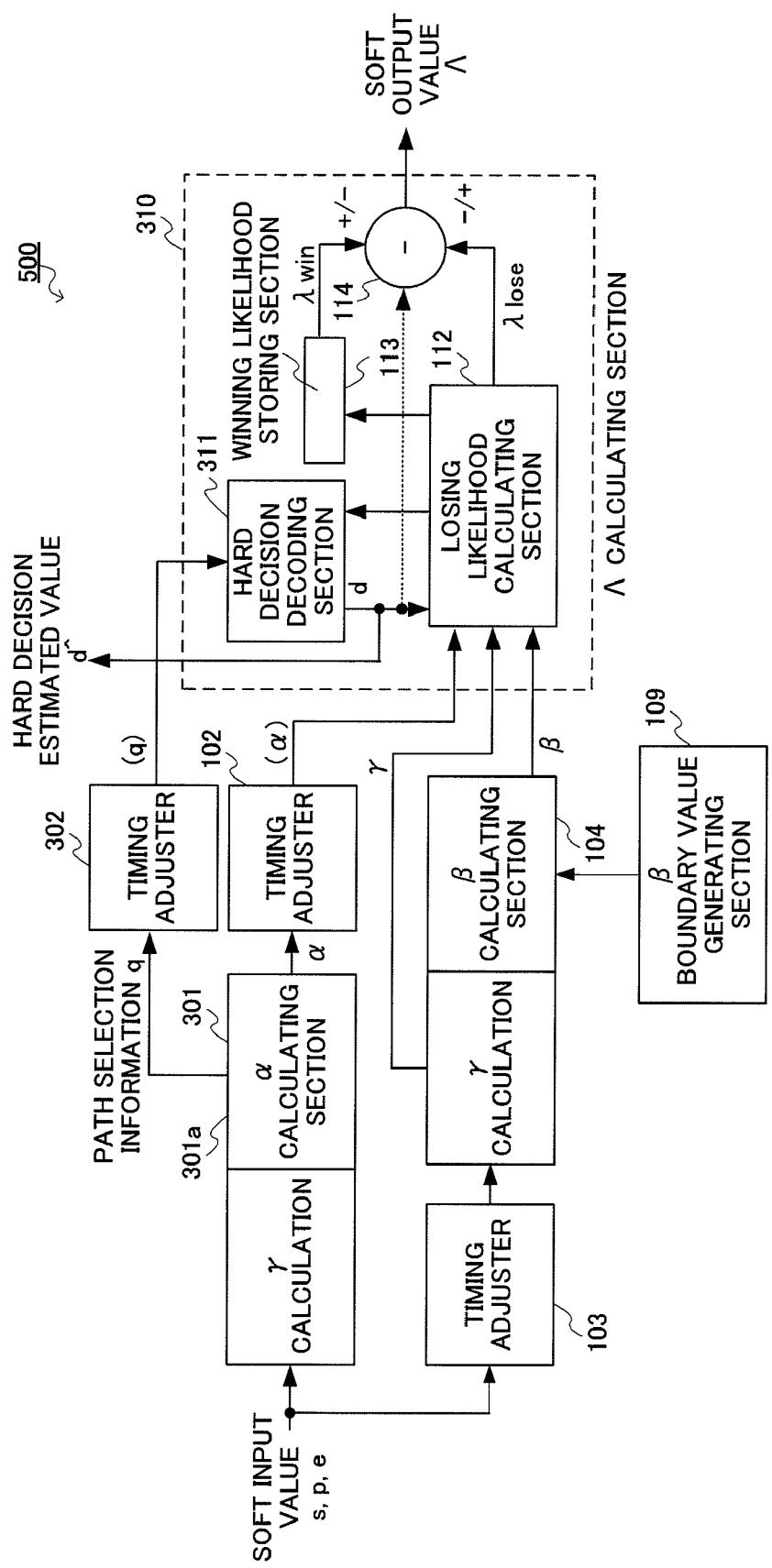
FIG. 29 is a block diagram showing a schematic configuration of the soft output decoder according to Embodiment 4 of the present invention.

FIG. 29 is a block diagram showing a schematic configuration of the soft output decoder according to Embodiment 4 of the present invention.

Soft output decoder 500 of FIG. 29 introduces the sliding window scheme by adding β boundary value generating section 109 to soft output decoder 300 of FIG. 20. Further, as described in Embodiment 3, differences between the configurations and operations of soft output decoder 500 and soft output decoder 300 can be explained in exactly the same way as the differences between soft output decoder 100 and soft output decoder 400.

Soft output decoder 500 outputs the output of hard decision decoding section 311 outside directly. When turbo decoding is carried out using soft output decoder 500, instead of carrying out hard decision of a soft output in the final stage of iterative decoding, by directly using the output of hard decision decoding section 311, the soft output needs not to be outputted and hard decision processing needs not to be carried out.

In this way, there are the following two points as features when soft output decoder 500 is used as the hard decision decoder.

First, soft output decoder 500 employs a configuration of carrying out Max-log-MAP processing (that is, calculate two likelihoods λ0(n) and λ1(n)) in the window boundary and carrying out hard decision decoding processing using the value determined then as the initial value (i.e. the maximum likelihood path state initial value), so that, compared to the Viterbi decoder, which is a conventional decoder, processing can be sped up, complicated memory operations such as the register exchange method are removed and power consumption can be reduced.

Second, when soft output decoder 500 is used as the hard decision decoder, losing likelihood calculating section 112 finds only the maximum likelihood path state initial value in the window boundary and stops the operation except in the window boundary.

By so doing, most of the time in which hard decision decoding is carried out, losing likelihood calculating section 112 stops the operation, so that power consumption can be reduced compared to the case where hard decision of the soft output is carried out using conventional Max-log-MAP decoder.

Further, when soft output decoder 500 is used as the hard decision decoder, power consumption can be reduced by further stopping the operations of timing adjuster 102, timing adjuster 103 and γβ calculating section 104.

Figure 30:
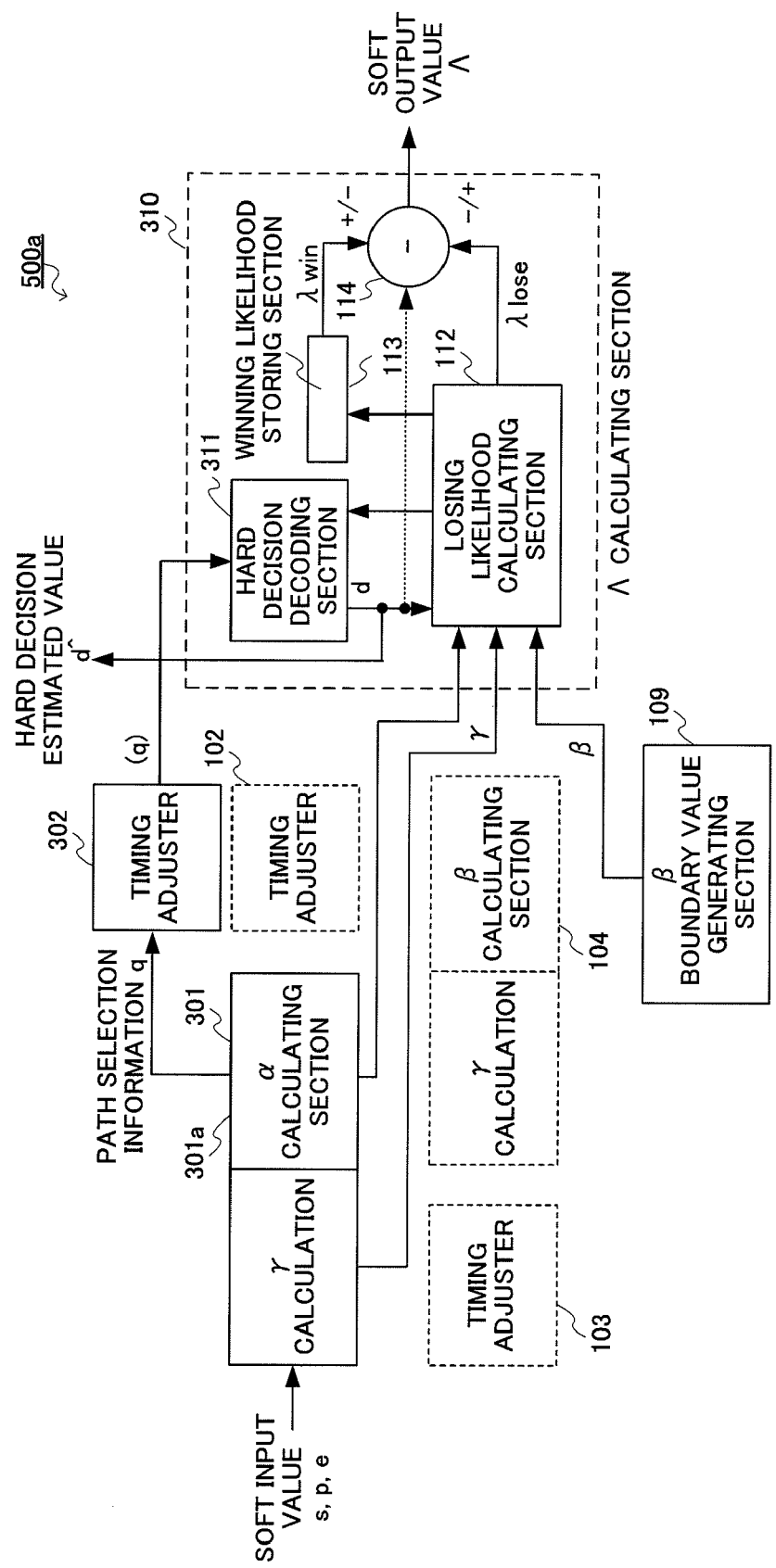
FIG. 30 is a block diagram showing a schematic configuration in a case where the soft output decoder according to Embodiment 4 of the present invention is used as the hard decision decoder.

FIG. 30 illustrates the state where these operations have stopped. When soft decision decoder 500 is used as the hard decision decoder, soft decision decoder 500 is operated practically as hard decision decoder 500a by changing the wiring electrically and stopping the above three blocks.

Although losing likelihood calculating section 112 operates only in the window boundary portion, the value β used then is inputted from β boundary generating section 109. Further, although the value γ may be inputted from γβ calculating section 104, by inputting the value γ from γα calculating section 301, γβ calculating section 104 is stopped completely and power consumption can be reduced.

Further, the value α is used only in the window boundary portion, so that the value α can be inputted to losing likelihood calculating section 112 without timing adjuster 102. As a result, the operation of timing adjuster 102 can be stopped and power consumption can be reduced.

As described above, soft output decoder 500 of the present invention employs a configuration of carrying out Max-log-MAP processing (that is, calculate two likelihoods $\lambda 0(n)$ and $\lambda 1(n)$) in the window boundary and carrying out hard decision decoding processing using the value determined then as the initial value (i.e. the maximum likelihood path state initial value), so that processing can be sped up and power consumption can be reduced.

Figure 31:
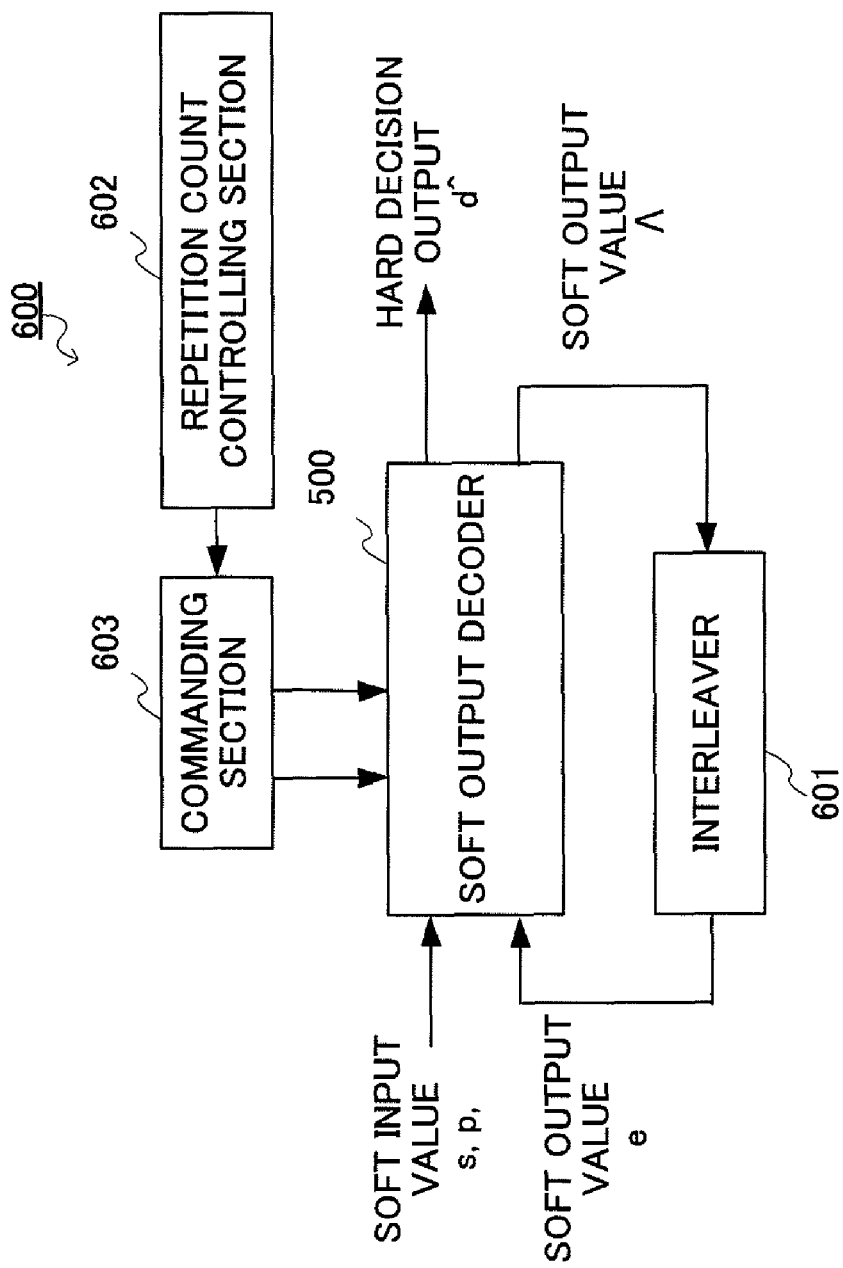
FIG. 31 is a block diagram showing a schematic configuration of the turbo decoder utilizing the soft output decoder according to Embodiment 4 of the present invention.

Further, FIG. 31 shows turbo decoder 600 utilizing above soft output decoder 500.

Turbo decoder 600 has interleaver 601, repetition count controlling section 602 and commanding section 603 in addition to soft output decoder 500.

Soft output decoder 500 inputs the soft input values s and β and soft input value e. In the beginning of repetition, the initial value such as 0 is inputted as the soft input e. After next repetition, the soft output value Λ of the soft output decoder rearranged by interleaver 601 is inputted as e.

Immediately before the prescribed repetition count is reached, repetition count controlling section 602 generates a signal showing that repetition is final and transmits the signal to commanding section 603.

Repetition count controlling section 602 decides that repetition is final according to the prescribed repetition count, and, in addition, may decide that repetition is final based on the state of the hard decision output or soft output value.

Receiving a signal showing that repetition is final from repetition count controlling section 602, commanding section 603 transmits an output stop command signal for a soft decision values.

Receiving the output stop command signal for a soft decision value, soft output decoder 500 carries out control to stop the operations of losing likelihood calculating section 112, timing adjuster 102, timing adjuster 103 and γβ calculating section 104 included inside soft output decoder 500.

In this way, commanding section 603 that, upon deciding that repetition is final, transmits an output stop command for the soft decision value to soft output decoder 500, is provided, so that power consumption required for turbo decoding can be reduced effectively.

Although soft output decoder 500 has been described with Embodiment 4 as an example, the same effect can be acquired in soft output decoder 400. However, the α and γ are used in hard decision decoding, and so only operations of losing likelihood calculating section 112 except in the window boundary portion and the β calculating section (no reference numeral) in the γβ calculation section can be stopped.

Further, in addition to the sliding window scheme, the principle of the present invention is applicable in the same way to the processing streamlining technique of Max-log-MAP based on data division. That is, hard decision decoding of one of both ends of divided data can be carried out in the same processing steps as in streamlined Max-log-MAP by applying <algorithm 1-A-1> described in the basic principle of the present invention, so that higher speed can be realized compared to Viterbi decoding and lower power consumption can be realized compared to the processing streamlining technique of conventional Max-log-MAP.

As an example of the processing streamlining technique of Max-log-MAP based on above data division, there is parallelization using subblock division. Parallelization using subblock division refers to dividing input data into a plurality of blocks and carrying out decoding each block. Further, sliding windowing is often carried out in each block.

The above description is an illustration of preferred embodiments of the present invention and the scope of the present invention is not limited to this.

Further, according to the above embodiments, smaller values of α, β, γ and λ represent the higher likelihoods (more likely). Implementation is made possible such that, higher values represent higher likelihoods, and the present invention is also applicable in this case.

Further, a method of setting initial values of α and β to certain values or subtracting certain values corresponding to an input value in γ, α and β calculation may be adopted to adjust the winning likelihood to a desired value (for example, 0). By so doing, a configuration may be possible where winning likelihood storing section 113 and subtractor 114 are practically unnecessary.

Further, although, with the present embodiment, the terms "soft output decoder," "iterative decoder," and "soft decision value calculating method" have been used for ease of description, the terms "decoder," "soft output Viterbi decoder," "turbo decoder," and "iterative decoding method" may be used.

Further, the present invention only needs to be realized by the soft output decoder, iterative decoder and soft decision value calculating method based on the algorithm, and the present invention can be realized naturally with a hardware configuration and also by a software for functioning the soft decision value calculating method. This software is stored in a computer readable recording medium.

Each function block employed in the description of each of the aforementioned embodiments may typically be implemented as an LSI constituted by an integrated circuit. These may be individual chips or partially or totally contained on a single chip. "LSI" is adopted here but this may also be referred to as "IC," "system "LSI," "super LSI," or "ultra LSI" depending on differing extents of integration. Further, the method of circuit integration is not limited to LSI's, and implementation using dedicated circuitry or general purpose processors is also possible. After LSI manufacture, utilization of a programmable FPGA (Field Programmable Gate Array) or a reconfigurable processor where connections and settings of circuit cells within an LSI can be reconfigured is also possible. Further, if integrated circuit technology comes out to replace LSI's as a result of the advancement of semiconductor technology or a derivative other technology, it is naturally also possible to carry out function block integration using this technology. Application of biotechnology is also possible.

The disclosures of Japanese Patent Application No. 2006-225938, filed on Aug. 22, 2006, and Japanese Patent Application No. 2006-251873, filed on Sep. 15, 2006, including the specifications, drawings and abstracts, are incorporated herein by reference in their entirety.

INDUSTRIAL APPLICABILITY

The soft output decoder, iterative decoder and soft decision value calculating method according to the present invention are preferable for application to, for example, a turbo decoding apparatus that carries out decoding using a soft decision decoding result repeatedly. For example, the soft output decoder, iterative decoding apparatus and soft decision value calculating method are preferable at the receiving end for use in a soft output decoder such as a convolution code decoder or turbo decoder, a receiving apparatus using cyclic code for detecting whether or not there are transmission errors or a communication terminal apparatus such as a mobile telephone.

The invention claimed is:

1. A soft output decoder that receives code words corresponding to a plurality of information words and calculates soft decision decoding results of the plurality of information words from a plurality of likelihood values corresponding to a plurality of candidate values adopted by the plurality of information words, the soft output decoder comprising:
a hard decision decoder that decides one of the plurality of candidate values as an estimated value; and
a likelihood calculator that bans calculation of a likelihood value corresponding to the estimated value and calculates other likelihood values corresponding to others of the plurality of candidate values in the plurality of likelihood values.

2. The soft output decoder according to claim 1, wherein the hard decision decoder decides one of a value 0 and a value 1 as the estimated value.

3. The soft output decoder according to claim 1, wherein the likelihood calculator calculates a smallest likelihood value when a number of the plurality of candidate values is two.

4. The soft output decoder according to claim 1, wherein, when a number of the plurality of candidate values is four, the likelihood calculator excludes a maximum likelihood value and calculates a rest of three likelihood values.

5. The soft output decoder according to claim 1, further comprising:
a soft decision value calculator that, when the likelihood value corresponding to the estimated value is a winning likelihood, calculates a difference between the winning likelihood and one of the other likelihood values.

6. The soft output decoder according to claim 5, wherein the winning likelihood is a prescribed fixed value.

7. The soft output decoder according to claim 1, further comprising:
a boundary winning likelihood calculator that defines one of the plurality of information words as a boundary portion and calculates a winning likelihood in the boundary portion;
a storage that holds the winning likelihood calculated in the boundary portion; and
a soft decision calculator that calculates the soft decision decoding results for the plurality of information words other than the boundary portion using the winning likelihood.

8. The soft output decoder according to claim 1, wherein the plurality of information words adopt one of a value 0 and a value 1, and
the soft decision decoding results of the plurality of information words are calculated based on a difference between a first likelihood value corresponding to the value 0 and a second likelihood value corresponding to the value 1.

9. The soft output decoder according to claim 1, wherein the plurality of candidate values comprise two candidate values of 0 and 1.

10. The soft output decoder according to claim 1, wherein the plurality of candidate values comprise four candidate values of 00, 01, 10 and 11.

11. The soft output decoder according to claim 5, wherein:
a received code word is divided into a plurality of blocks;
soft decision is carried out for each of the plurality of blocks; and
a winning likelihood varying between the plurality of blocks is used.

12. The soft output decoder according to claim 1, wherein likelihood calculation is carried out using a sliding window for data subjected to error correction coding by turbo code.

13. The soft output decoder according to claim 12, further comprising:
a boundary winning likelihood calculator that defines one of both ends of the sliding window as a boundary portion and calculates a winning likelihood in the boundary portion;
a storage that holds the winning likelihood calculated in the boundary portion; and
a soft decision calculator that calculates the soft decision decoding results for the plurality of information words other than the boundary portion using the winning likelihood.

14. The soft output decoder according to claim 1, further comprising:
a boundary likelihood calculator that defines one of the plurality of information words as a boundary portion and finds a plurality of boundary likelihood values corresponding to the plurality candidate values adopted by the plurality of information words in the boundary portion; and
an initial state number specifier that specifies a state number to which a maximum likelihood branch is connected using the plurality of boundary likelihood values,
wherein the hard decision decoder decides the estimated value for the plurality of information words other than the boundary portion using the state number.

15. The soft output decoder according to claim 14, wherein, when receiving an output stop command for a soft decision value and when receiving an output command for a hard decision value, the likelihood calculator bans likelihood calculation for the plurality of information words other than the boundary portion.

16. The soft output decoding apparatus according to claim 1, further comprising:
a repetition count controller that controls the soft output decoder to calculate the soft decision decoding results of the plurality of information words for a prescribed repetition count; and a commander that, when the prescribed repetition count is reached, commands the soft output decoder to calculate a hard decision value and stop calculating the soft decision decoding results.

17. A soft decision value calculating method for receiving code words corresponding to a plurality of information words and calculating soft decision decoding results of the plurality of information words from a plurality of likelihood values corresponding to a plurality of candidate values adopted by the plurality of information words, the soft decision value calculating method comprising:
    deciding one of the plurality of candidate values as an estimated value; and
    banning calculation of a likelihood value corresponding to the estimated value and calculating other likelihood values corresponding to others of the plurality of candidate values in the plurality of likelihood values.

* * * * *